(12) United States Patent
Akiba

(10) Patent No.: US 6,894,215 B2
(45) Date of Patent: May 17, 2005

(54) THERMOELECTRIC MODULE

(75) Inventor: Hironori Akiba, Tokyo (JP)

(73) Assignee: Komatsu Ltd., Tokyo (JP)

( * ) Notice: Subject to any disclaimer, the term of this patent is extended or adjusted under 35 U.S.C. 154(b) by 178 days.

(21) Appl. No.: 10/348,153

(22) Filed: Jan. 21, 2003

(65) Prior Publication Data

US 2003/0140957 A1 Jul. 31, 2003

(30) Foreign Application Priority Data

Jan. 25, 2002 (JP) ........................... 2002-016492
Jun. 27, 2002 (JP) ........................... 2002-188768

(51) Int. Cl.$^7$ .................... H01L 35/02; H01L 35/32
(52) U.S. Cl. ............... 136/208; 136/209; 136/211; 136/212; 136/227; 136/224; 136/204; 136/225; 257/467; 257/470; 165/104.33; 165/80.2
(58) Field of Search ............... 136/208, 209, 136/211, 212, 227, 224, 204, 225; 257/467, 470; 165/104.33, 80.2

(56) References Cited

U.S. PATENT DOCUMENTS

| | | | | |
|---|---|---|---|---|
| 2,919,553 A | * | 1/1960 | Fritts | 62/3.3 |
| 3,004,393 A | * | 10/1961 | Alsing | 62/3.3 |
| 3,481,794 A | * | 12/1969 | Kasschau | 136/208 |
| 5,254,178 A | * | 10/1993 | Yamada et al. | 136/204 |
| 6,347,521 B1 | * | 2/2002 | Kadotani et al. | 62/3.7 |

FOREIGN PATENT DOCUMENTS

| | | |
|---|---|---|
| JP | 61-254082 A | 11/1986 |
| JP | 62-281776 A | 12/1987 |
| JP | 3-91272 A | 4/1991 |
| JP | 03-091272 A | 4/1991 |
| JP | 5-168264 A | 7/1993 |
| JP | 7-86641 A | 3/1995 |
| JP | 7-335943 A | 12/1995 |

OTHER PUBLICATIONS

A. Yamamoto et al; Analysis on Power Generating Characteristics of Cylindrical Shaped Thermoelectric Module; Mar. 15, 2000; pp. 15–19.

* cited by examiner

*Primary Examiner*—Alan Diamond
(74) *Attorney, Agent, or Firm*—Frishauf, Holtz, Goodman & Chick, P.C.

(57) ABSTRACT

A thermoelectric module with a simple structure with less breakage by thermal stress is provided. For this purpose, the thermoelectric module includes p-type and n-type thermoelectric elements (13, 14) which are alternately placed, and outer electrodes (15) and inner electrodes (16), which are alternately placed between the thermoelectric elements (13, 14), and at least part of at least either one of the outer electrode (15) or the inner electrode (16) has a shape approximately along an object which exchanges heat with the electrodes (15, 16). The inner electrodes (16) surround an object which exchanges heat with the electrodes (15, 16).

19 Claims, 20 Drawing Sheets

F I G. 1 2
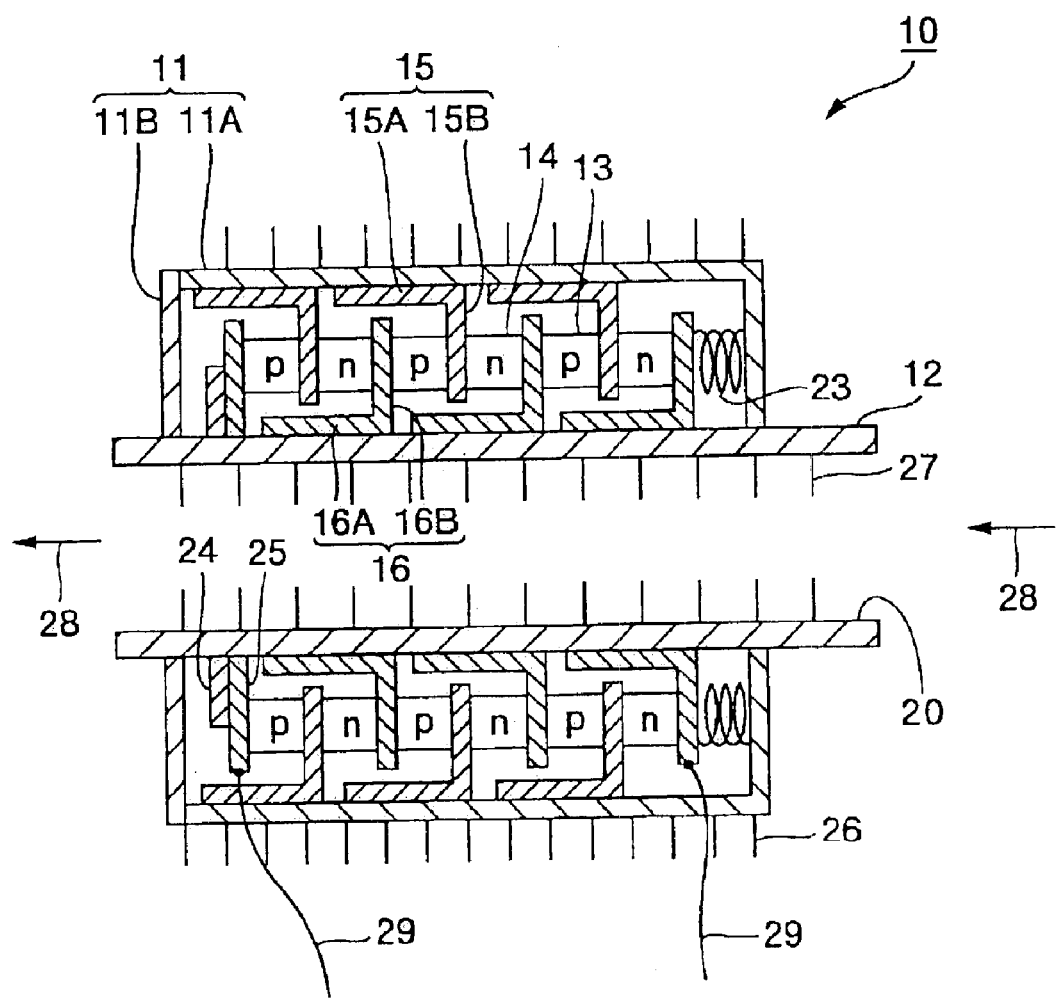

THERMOELECTRIC MODULE

TECHNICAL FIELD

The present invention relates to a thermoelectric module.

BACKGROUND ART

Conventionally, cylindrical thermoelectric modules to perform power generation by utilizing exhaust heat of exhaust pipes of automobiles, boilers and the like to recover energy are known. For example, the one disclosed in Japanese Patent Laid-open No. 61-254082 is called a first prior art. FIG. 36 shows a thermoelectric module disclosed in the same Laid-open Patent, and the first prior art will be explained below based on FIG. 36. In FIG. 36, a thermoelectric module 110 includes a hollow pipe 112 being an inner cylinder and a housing 111 being an external cylinder. P-type and n-type thermoelectric elements 113 and 114 are alternately placed in a circumferential direction between the pipe 112 and the housing 111.

First end portions of the thermoelectric elements 113 and 114 are connected by an inner electrode 116, and the inner electrode 116 is in contact with a pipe 112 via an insulator (not shown). The other end portions of the thermoelectric elements 113 and 114 are connected by an outer electrode 115 and the outer electrode 115 is in contact with a housing 111 via an insulator (not shown). For example, when an exhaust gas having heat passes through an inside of the pipe 112, an electromotive force occurs by a Seebeck effect to the thermoelectric elements 113 and 114. This electromotive force is taken from electric power line 129, whereby power generation utilizing exhaust heat is performed.

An example of forming the cylindrical thermoelectric module 110 by using the ring-shaped thermoelectric elements 113 and 114 is described in "Analysis on Power Generating Characteristics of Cylindrical Shaped Thermoelectric Module", that is the data of New Energy and Environment Study Group, issued by The Institute of Electrical Engineer of Japan on May 15, 2000. This is called a second prior art. A perspective view of the second prior art will be shown in FIG. 37. As shown in FIG. 37, in the second prior art, the ring-shaped thermoelectric elements 113 and 114 are alternately arranged between the pipe 112 and the housing 111, and the disc-shaped electrodes 115 and 116 are placed between them. By a power line (not shown), an electromotive force is taken.

However, the aforementioned prior arts have the problems that will be described as follows. Namely, in the first prior art, as shown in FIG. 36, the electrodes 115 and 116 are constituted to have curvatures along wall surfaces of the cylinders, and the thermoelectric elements 113 and 114 are joined to curved surfaces of the electrodes 115 and 116. In order to realize this, it is necessary to construct the thermoelectric elements 113 and 114 to have curvatures similarly to the electrodes 115 and 116. Otherwise, adhesion between the thermoelectric elements 113 and 114 and the electrodes 115 and 116 is decreased to cause electric resistance, and a current does not flow favorably, thus reducing power generation performance of the thermoelectric module 110.

However, the thermoelectric elements 113 and 114 are generally produced by cutting sintered wafer and rod materials. Therefore, it is easy to produce them in a columnar shape and a rectangular parallelepiped shape, but it is very difficult to produce the surfaces in contact with the electrodes 115 and 116 to have the curvatures corresponding to the electrodes 115 and 116, as in FIG. 36. Namely, in order to realize such a thermoelectric module 110, it is necessary to produce the thermoelectric elements 113 and 114 in special shapes corresponding to the shapes of the pipe 112 and the housing 111, thus causing the problem of requiring very high cost.

Further, according to the first prior art, the thermoelectric elements 113 and 114, and the electrodes 115 and 116 are joined by soldering. Since the temperature of an exhaust gas sometimes becomes extremely high, the temperature difference between the inner electrode 116 and the outer electrode 115 becomes large. As a result, the pipe 112 expands, and large stress is exerted on the thermoelectric elements 113 and 114 and joint portions, and any one of them is sometimes broken. As an art of preventing breakage of soldering as described above, there is the one disclosed in, for example, Japanese Patent Laid-open No. 3-91272. This is what is made by stacking the p-type thermoelectric element, the electrode at the heat absorption side, the n-type thermoelectric element, and the electrode at the heat exhaust side alternately in one row in this order. By fastening them together, joint portions are eliminated so that even stress caused by heat is exerted thereon, the thermoelectric module is not broken.

However, in the art disclosed in Japanese Patent Laid-open No. 3-91272, a concrete constitution as to how heat is exchanged, for example, when the heat source is solid, or liquid, is not disclosed. The constitution as to how such a thermoelectric module is used, for example, when heat is taken from the exhaust heat of the cylindrical exhaust pipe as in the first and the second prior arts is not described. In the second prior art, the ring-shaped thermoelectric elements 113 and 114 are produced. Such ring-shaped thermoelectric elements 113 and 114 need to be produced by a special order, which requires very high cost.

SUMMARY OF THE INVENTION

The present invention is made in view of the above-described problems, and has its object to provide a thermoelectric module with a simple structure and with less breakage by thermal stress.

In order to attain the above-described object, a first aspect of the thermoelectric module according to the present invention includes p-type and n-type thermoelectric elements which are alternately placed, and outer electrodes and inner electrodes which are alternately placed between the thermoelectric elements, and at least part of at least either one of the outer electrode or the inner electrode has a shape approximately along an object which exchanges heat with the electrodes. According to this constitution, it is extremely easy to make the shape of the electrode along the shape of the object as compared with conforming the shape of the thermoelectric element to the shape of the object. As a result, heat is efficiently transmitted, and the efficiency of the thermoelectric module is enhanced.

A second aspect of the thermoelectric module according to the present invention includes p-type and n-type thermoelectric elements which are alternately placed, and outer electrodes and inner electrodes which are alternately placed between the thermoelectric elements, and the inner electrodes surround an object which exchanges heat with the electrodes. According to the constitution, heat of the object can be efficiently transmitted to the electrode from its circumference, and the efficiency of the thermoelectric module is enhanced.

BRIEF DESCRIPTION OF THE DRAWINGS

FIG. 12 is a sectional front view of a thermoelectric module according to a third embodiment of the present invention;

FIG. 25 shows a state in which an outer electrode is placed at a predetermined position, FIG. 26 shows a step of applying cream solder to the outer electrode, FIG. 27 shows a state in which p-type thermoelectric elements are placed on the cream solder, FIG. 28 shows a step of placing a weight on the p-type thermoelectric elements from above and performing soldering, FIG. 29 shows a step of applying cream solder to a back surface of the bottom plate of the outer electrode, FIG. 30 shows a step of alternately laying the p-type and n-type thermoelectric units on each other and performing soldering.

BEST MODE FOR CARRYING OUT THE INVENTION

Hereinafter, with reference to the drawings, preferred embodiments according to the present invention will be explained in detail.

Figure 1:
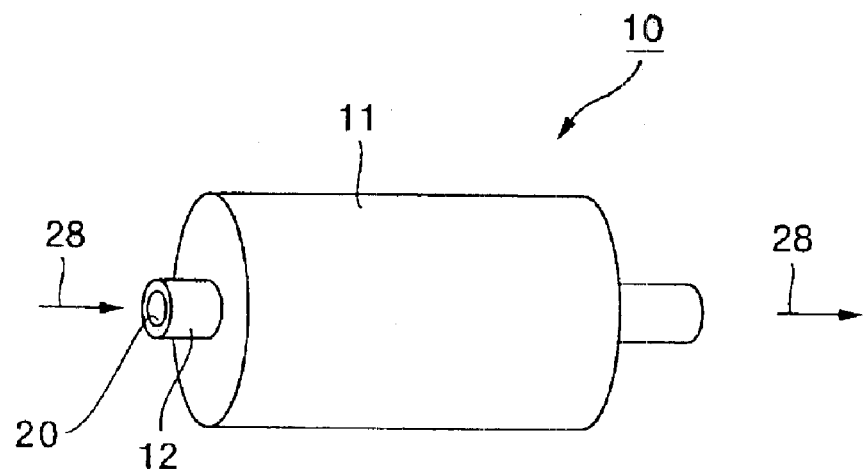
FIG. 1 is an external view of a thermoelectric module according to a first embodiment of the present invention.

A first embodiment will be explained at first. FIG. 1 shows an external view of a thermoelectric module 10 according to the embodiment. In FIG. 1, the thermoelectric module 10 includes a hollow cylindrical pipe 12, and a hollow housing 11 with the pipe 12 being fitted in substantially a center part thereof. Thermoelectric elements that will be described later and electrodes are placed in a space between the housing 11 and the pipe 12. In the power generation type thermoelectric module 10, electromotive power is generated by thermal energy of an exhaust gas 28 passing through an inside of the pipe 12 to perform power generation. In a temperature adjustment type thermoelectric module, temperature adjustment of fluid passing through the inside of the pipe 12 is performed.

Figure 2:
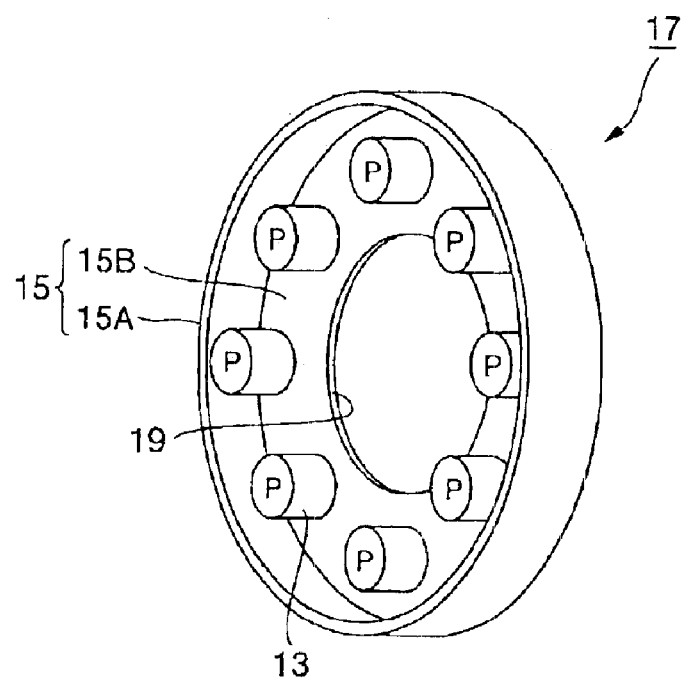
FIG. 2 is a block diagram of a p-type thermoelectric unit according to the first embodiment.

FIG. 2 shows a block diagram of a p-type thermoelectric unit 17 which combines the p-type thermoelectric elements 13 and an outer electrode 15. The outer electrode 15 is in a shape of a tea caddy with only one end part of a cylinder being closed with a bottom plate 15B. A cylindrical member of the outer electrode 15 is called an outer heat transfer plate 15A. A circular hole 19 with a larger diameter than the pipe 12 is provided in substantially a center part of the bottom plate 15B. A plurality of p-type thermoelectric elements 13 are arranged in a circumferential form around the hole 19, and bottom surfaces of the p-type thermoelectric elements 13 and the bottom plate 15B are joined by soldering or the like. In the explanation below, the surfaces on which the thermoelectric elements 13 and 14 are joined to the bottom plates 15B and 16B are called bottom surfaces of the thermoelectric elements 13 and 14, and surfaces on an opposite side thereof are called top surfaces. The shapes of the thermoelectric elements 13 and 14 are explained as columnar shapes in the below, but they may be other shapes such as a rectangular parallelepiped.

Figure 3:
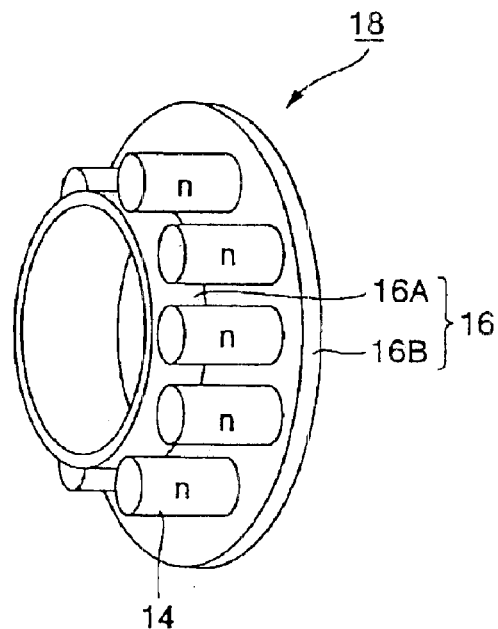
FIG. 3 is a block diagram of an n-type thermoelectric unit according to the first embodiment.

FIG. 3 shows a block diagram of an n-type thermoelectric unit 18 which combines n-type thermoelectric elements 14 and the inner electrode 16. The inner electrode 16 is in a shape with an inner heat transfer plate 16A, which has an inner diameter in which the pipe 12 is fitted with substantially no clearance, being perpendicularly raised in substantially a center part of the circular bottom plate 16B. A plurality of n-type thermoelectric elements 14 are arranged in a circumferential form on the bottom plate 16B of the n-type thermoelectric unit 18, and bottom surfaces of the n-type thermoelectric elements 14 and the bottom plate 16B are joined by soldering or the like.

Figure 4:
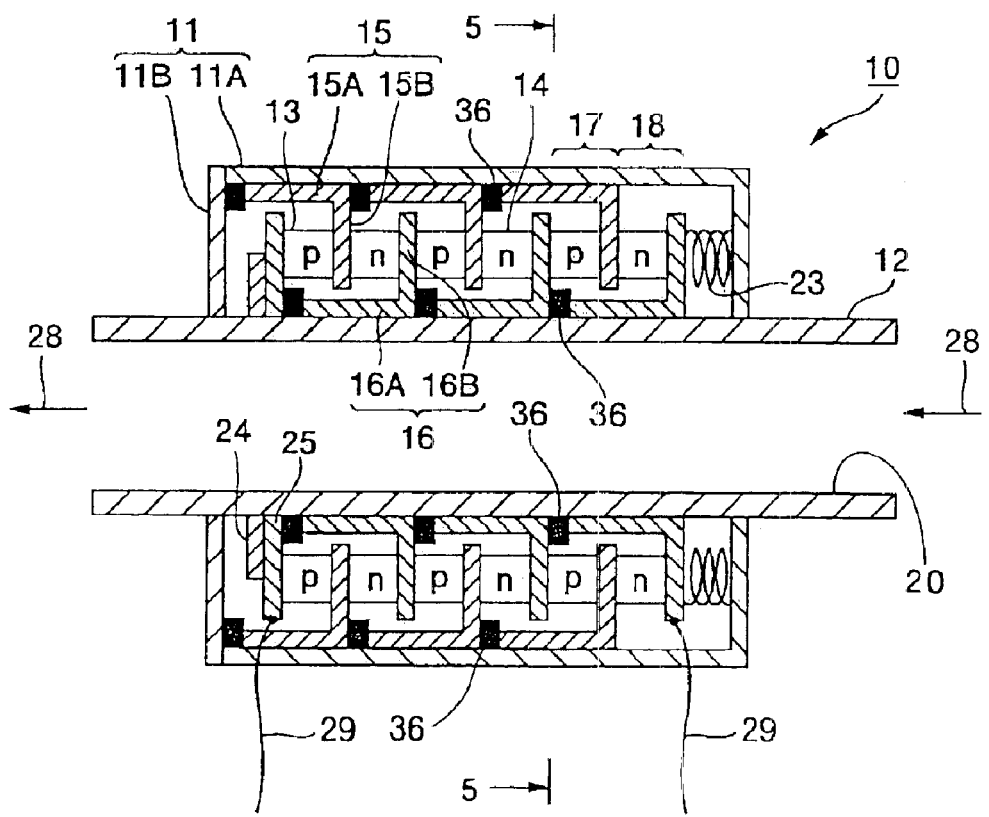
FIG. 4 is a sectional front view of the thermoelectric module according to the first embodiment.
Figure 5:
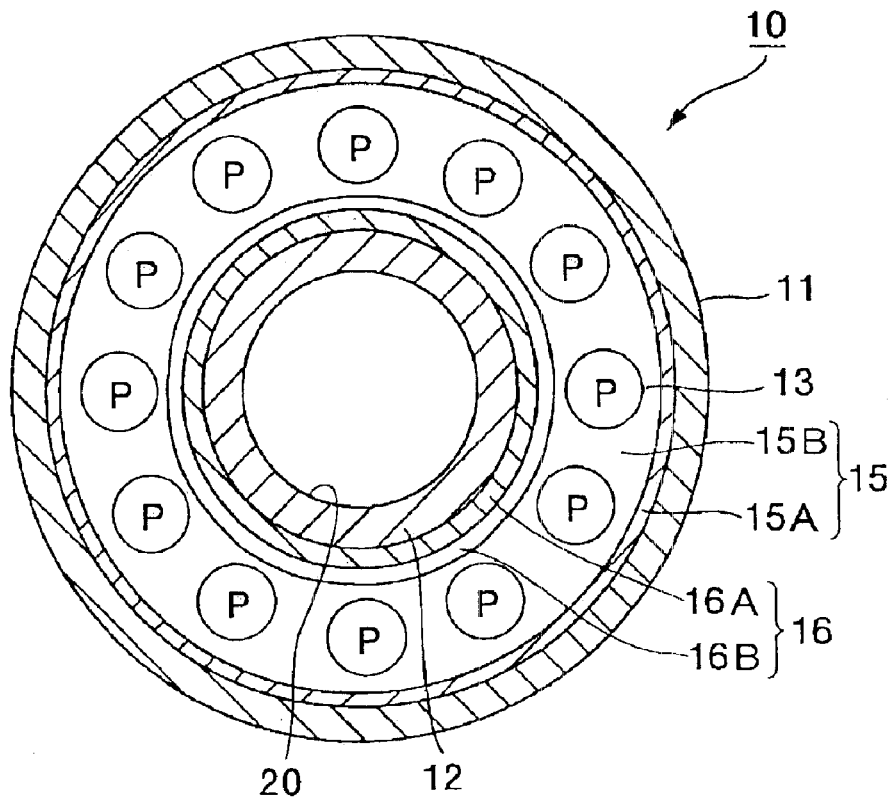
FIG. 5 is a sectional view taken along the line 5—5 in FIG. 4.

FIG. 4 shows a sectional front view of the thermoelectric module 10, and FIG. 5 shows a sectional side view seen in the 5—5 direction in FIG. 4. The housing 11 includes a main body part 11A in a tea caddy shape and a lid part 11B. First, the pipe 12 is fitted into the main body part 11A of the housing 11 and joined to it. Then, inside the housing 11, a spring 23 is inserted from the left side in FIG. 4, and the n-type thermoelectric units 18 and the p-type thermoelectric units 17 are alternately inserted. The outer surface of the outer heat transfer plate 15A is formed so that its curvature conforms to that of an inner surface of the housing 11, and the inner surface of the inner heat transfer plate 16A is formed so that its curvature conforms to that of an outer surface of the pipe 12. As a result, the outer surface of the outer heat transfer plate 15A is in close contact with the inner surface of the housing 11, and the inner surface of the inner heat transfer plate 16A is in close contact with the outer surface of the pipe 12. In this situation, it is suitable to enhance thermal conductivity with heat conduction grease or the like being applied between them.

In this situation, it is suitable to make the height of the outer heat transfer plate 15A in an axial direction large, as long as it does not touch the adjacent outer heat transfer plate 15A. As a result, a contact area of the outer heat transfer plate 15A and the inner surface of the housing 11 is made larger, thus improving thermal conductivity. As shown in FIG. 4, if an electrically insulating insulator 36 is inserted between the outer heat transfer plate 15A and the adjacent outer heat transfer plate 15A, insulation is made more reliable. This can be applied similarly to the inner heat transfer plate 16A.

After the thermoelectric units 17 and 18 are inserted, a power line-connecting electrode 25 is fitted onto the pipe 12 from the left side in FIG. 4. A thread is formed in the vicinity of a left end part of the pipe 12 in FIG. 4, and a fixing nut 24 is screwed into the thread. The lid part 11B is joined or fitted to the main body part 11A of the housing 11, whereby the thermoelectric module 10 according to this embodiment is formed. As a result, as shown in FIG. 4, the p-type and n-type thermoelectric elements 13 and 14 are alternately placed between the housing 11 and the pipe 12 via the outer electrodes 15 and the inner electrodes 16. Namely, the bottom surface of the p-type thermoelectric element 13 is in contact with the outer electrode 15, and the top surface thereof is in contact with the inner electrode 16. On the other hand, the bottom surface of the n-type thermoelectric element 14 is in contact with the inner electrode 16, and the top surface thereof is in contact with the outer electrode 15.

In this situation, the inner electrode 16 and the p-type thermoelectric element 13 are firmly pressed against each other to be in close contact with each other by screwing of the nut 24 and a biasing force of the spring 23, and though they are not joined to each other, they are electrically continuous. The same things take place between the outer electrode 15 and the n-type thermoelectric element 14. Insulation layers (not shown) are formed on the outer surface of the pipe 12 and the inner surface of the housing 11, and prevent continuity from being established between the electrodes 15 and 16. Alternatively, it is suitable to form an insulation layer on a surface of each of the heat transfer plates 15A and 16A that is in contact with the pipe 12 or the housing 11. Power lines 29 and 29 are connected to the power line-connecting electrode 25 and the inner electrode 16 at the right end part in FIG. 4. The power lines 29 and 29 are taken outside the housing 11 via introduction terminals (not shown) without being in electrical contact with the housing 11.

An operation by the constitution of the above-described first embodiment will be explained. Such a thermoelectric module 10 is connected to, for example, an exhaust pipe of an automobile so that the exhaust gas 28 passes through an inside of the pipe 12. Thereby, the heat of the exhaust gas 28 warms the inner electrode 16 via the pipe 12. On the other hand, the housing 11 is in contact with outside air and has lower temperature than the inside of the pipe 12, and therefore the temperature difference occurs between the top surfaces and the bottom surfaces of the p-type thermoelectric element 13 and the n-type thermoelectric element 14 via the outer heat transfer plate 15A and the inner heat transfer plate 16A. As a result, electromotive power by a Seebeck effect occurs to the thermoelectric elements 13 and 14. The electromotive power is taken from between the power lines 29 and 29, whereby power generation utilizing exhaust heat becomes possible.

As an application example, if a current is passed through the thermoelectric elements 13 and 14 via the power lines 29 and 29, it becomes possible to cool or heat the pipe 12 according to the directions of the current. Accordingly, it is possible to feed fluid to an inside of the pipe 12 to adjust the temperature of this fluid. For example, it is possible to feed a chemical solution such as a resist solution, which is used in a semiconductor production apparatus, into the pipe 12, and control the temperature of this chemical solution precisely.

As explained above, according to the first embodiment, the p-type thermoelectric elements 13 and the n-type thermoelectric elements 14 are alternately placed in an axial direction between the cylindrical housing 11 and the pipe 12 penetrating through the inside thereof. The outer electrode 15 thermally in contact with the housing 11 along it and the inner electrode 16 thermally in contact with the pipe 12 along it are alternately attached between the p-type thermoelectric elements 13 and the n-type thermoelectric elements 14. As a result, the ordinary thermoelectric elements 13 and 14 such as those in a rectangular parallelepiped and columnar shapes can be used, thus reducing the cost of the device. Further, by using the ordinary thermoelectric elements 13 and 14, the performances of power generation and temperature adjustment are predictable.

Further, according to the first embodiment, the outer electrode 15 and the inner electrode 16 include the bottom plates 15B and 16B, and the heat transfer plates 15A and 16A that are substantially perpendicular to them, and they are brought into close contact with the housing 11 and the pipe 12. Consequently, degree of adhesion between the housing 11 and the pipe 12, and the electrodes 15 and 16 is increased, and therefore heat is easily transmitted with less loss. Accordingly, when it is used as a power generation device, a more electromotive force can be obtained. Further, when it is used as a temperature adjusting device, more precise temperature adjustment is possible, and the adjustment range of temperature is increased.

Further, the bottom surfaces of the thermoelectric elements 13 and 14 and the electrodes 15 and 16 are soldered, respectively, and the top surfaces of the thermoelectric elements 13 and 14 and the electrodes 15 and 16 are brought into close contact by the biasing force of the spring 23, respectively. As a result, even if thermal stress occurs due to temperature difference, deviation of the close contact spot absorbs the stress, and it rarely happens that joint portion and the thermoelectric elements 13 and 14 are broken as in the case when all of them are soldered. Further, the units, which are made by joining the thermoelectric elements 13 and 14, and the electrodes 15 and 16 by soldering outside the housing 11, are inserted. As a result, it is not necessary to perform soldering inside the housing, thus facilitating assembly. It is not especially necessary to align the position of the p-type thermoelectric element 13 and the n-type thermoelectric element 14 axially adjacent thereto, thus facilitating assembly.

Figure 6:
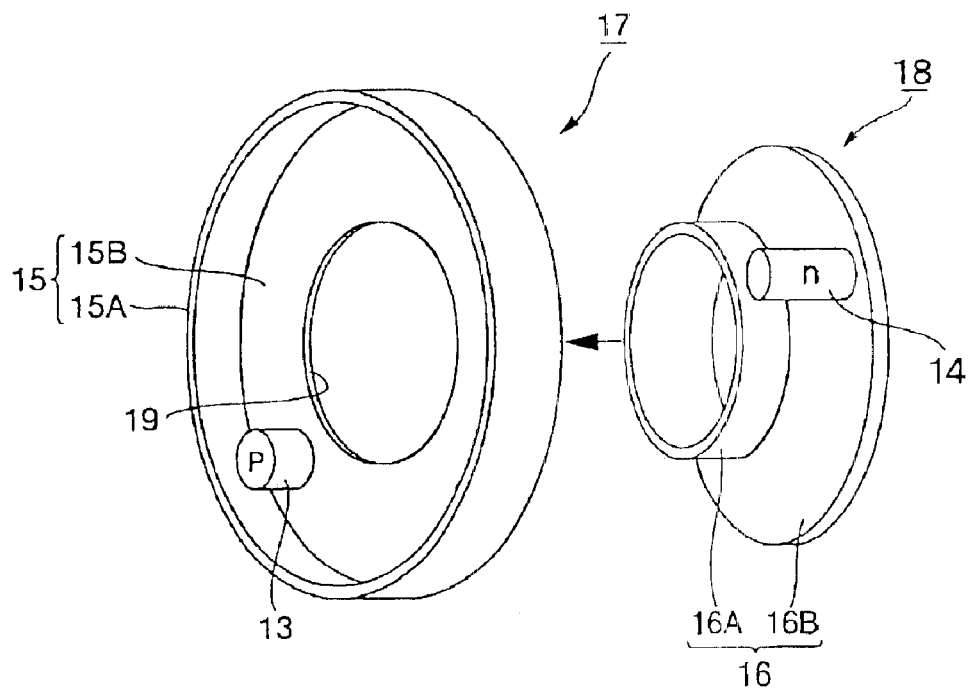
FIG. 6 is an explanatory view showing another constitution example of the thermoelectric module according to the first embodiment.

In the above-described explanation, the thermoelectric elements 13 and 14 are arranged in a circumferential form in a single layer on the electrodes 15 and 16, but this is not restrictive. It may be suitable to arrange, for example, the smaller thermoelectric elements 13 and 14 in a concentric form, a zigzag form, a honeycomb form, or at random in multiple layers. Further, as shown in FIG. 6, the numbers of the thermoelectric elements 13 and 14 are not limited to being plural, but they may be singular. Furthermore, the thermoelectric units 17 and 18 are not limited to being arranged in multiple layers, and a combination of only one of the p-type thermoelectric unit 17 and one of the n-type thermoelectric unit 18 maybe adopted.

Figure 7:
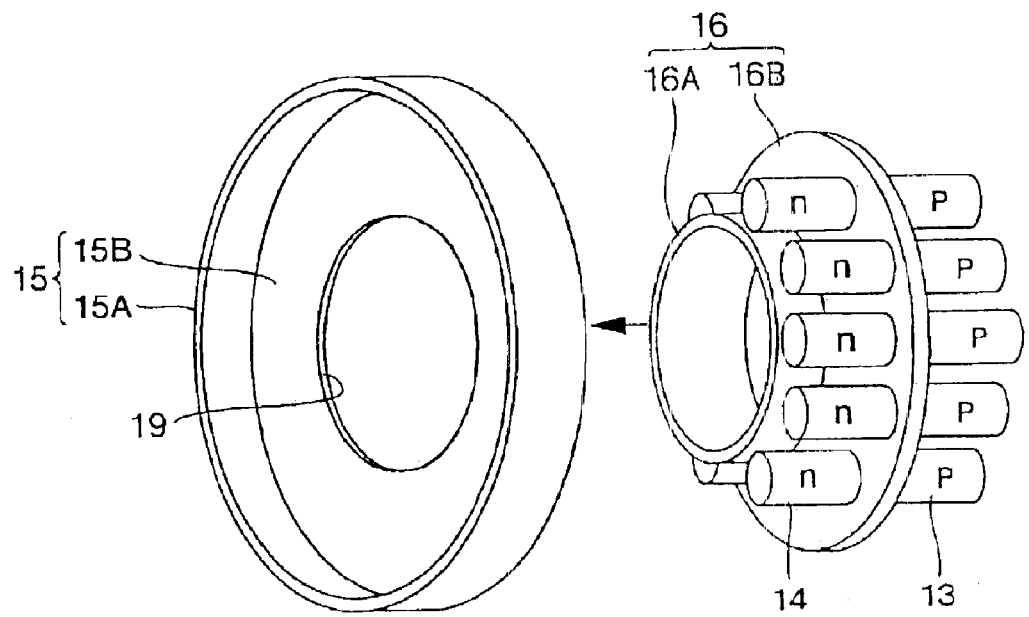
FIG. 7 is an explanatory view showing another constitution example of the thermoelectric module according to the first embodiment.

It is described that the outer electrode 15 is joined to the p-type thermoelectric elements 13 and the inner electrode 16 is joined to the n-type thermoelectric elements 14, but this is not restrictive, and the outer electrode 15 may be joined to the n-type thermoelectric elements 14, and the inner electrode 16 may be joined to the p-type thermoelectric elements 13, respectively. Further, the top surfaces of the thermoelectric elements 13 and 14 and the bottom plates 15B and 16B of the electrodes 15 and 16 may be joined. Further, as shown in FIG. 7, the top surfaces of the p-type thermoelectric elements 13 and the bottom surfaces of the n-type thermoelectric elements 14 may be joined to the inner electrode 16, and the outer electrode 15 may be pressed against this. It goes without saying that the thermoelectric elements 13 and 14 may be joined to the outer electrode 15, and the inner electrode 16 may be pressed against this.

It is described that the thermoelectric units 17 and 18 are formed by soldering the thermoelectric elements 13 and 14 and the electrodes 15 and 16 outside the housing 11, but this is not restrictive. For example, it may be suitable to constitute the thermoelectric module 10 without using soldering by fitting the electrodes 15 and 16 onto the pipe 12, and repeatedly arranging the thermoelectric elements 13 and 14 thereon, and finally fitting the housing 11 onto the pipe 12.

Figure 8:
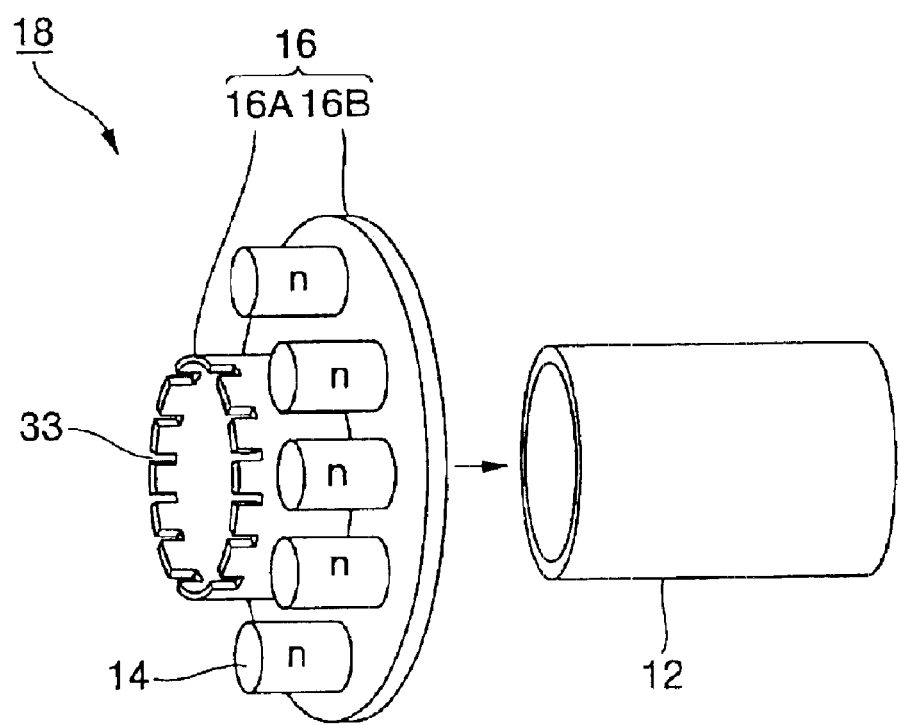
FIG. 8 is an explanatory view showing another constitution example of an inner electrode according to the first embodiment.

FIG. 8 shows another constitution example of the n-type thermoelectric unit 18. In FIG. 8, notches 33 are provided at the inner heat transfer plate 16A of the inner electrode 16. The inner diameter of the inner heat transfer plate 16A has the dimension having about a fit tolerance with the pipe 12, and the inner heat transfer plate 16A is pressed onto the pipe 12 by exerting a force by a press. As a result, contact between the inner heat transfer plate 16A and the pipe 12 becomes closer, and thermal conductivity is enhanced, therefore constituting the highly efficient thermoelectric module 10 with less heat loss. This is similarly applied to the outer electrode 15. The notches 33 are provided at the outer heat transfer plate 15A and the outer transfer plate 15A is made in such a size as to be narrowly pressed into the housing 11, whereby thermal conductivity between the outer heat transfer plate 15A and the housing 11 can be more enhanced.

Figure 9:
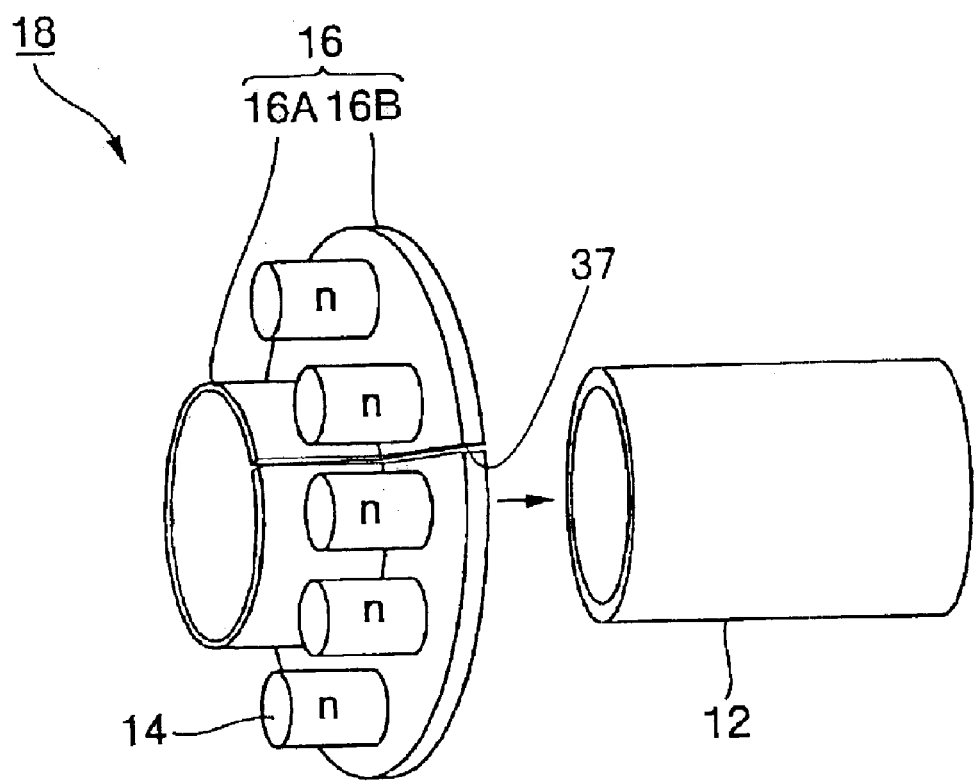
FIG. 9 is an explanatory view showing another constitution example of the inner electrode according to the first embodiment.

As shown in FIG. 9, a split 37 may be provided in the inner heat transfer plate 16A and the bottom plate 16B of the inner electrode 16, and the inner electrode 16 may be formed into a shape with one part being nicked. In this situation, the inner diameter of the inner heat transfer plate 16A is made a little smaller than the outer diameter of the pipe 12. By pressing the pipe 12 into such an inner electrode 16, the inner electrode 16 which is expanded by being deformed tries to return and fastens the pipe 12. Namely, the deformation of the inner electrode 16 works as a spring, and adhesion between the inner electrode 16 and the pipe 12 is increased. The split 37 like this is similarly applicable to the outer electrode 15.

Figure 10:
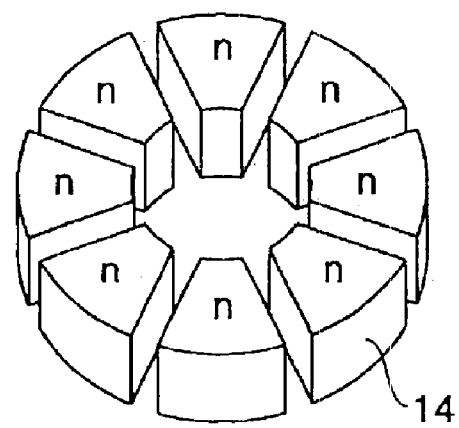
FIG. 10 is an explanatory view showing another constitution example of a thermoelectric element according to the first embodiment.

Further, similarly to what is shown, for example, in the second prior art (FIG. 35), the ring-shaped thermoelectric elements 13 and 14 may be produced, and they may be joined to the outer electrode 15 and the inner electrode 16. This makes it possible to arrange a larger number of thermoelectric elements 13 and 14 as compared with what is made by arranging the thermoelectric elements 13 and 14 in rectangular parallelepiped and columnar shapes, and therefore the ability of the thermoelectric module 10 is increased. Further, as shown in FIG. 10, the thermoelectric elements 13 and 14 in sector forms may be produced, and they may be arranged to constitute the thermoelectric elements 13 and 14 in ring shapes. As a result of constituting the rings by a plurality of thermoelectric elements 13 and 14, even when a failure occurs when the thermoelectric elements 13 and 14 are produced, for example, only the small thermoelectric elements 13 and 14 to which the failure occurs have to be replaced, and it is not necessary to replace all the thermoelectric elements 13 and 14 in the ring shapes.

Figure 11:
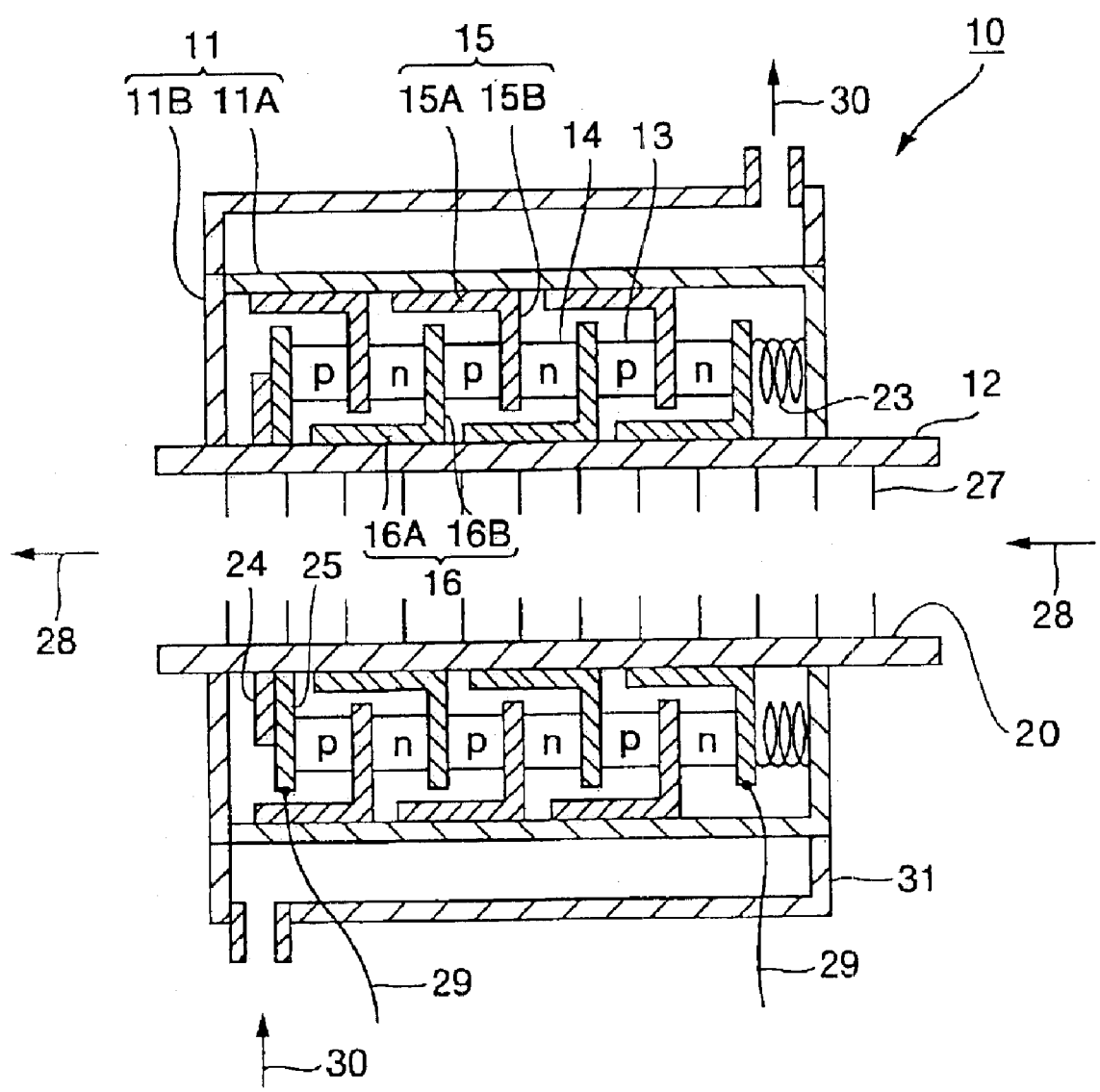
FIG. 11 is a sectional front view of a thermoelectric module according to a second embodiment of the present invention.

Next, a second embodiment will be explained. FIG. 11 shows a sectional front view of the thermoelectric module 10 in the second embodiment. In FIG. 11, the thermoelectric module 10 includes a water cooling jacket 31 which water-cools a periphery of the housing 11. By passing cooling water 30 into the water-cooling jacket 31, it is made possible to cool the housing 11 more efficiently, and enhance the efficiency of power generation and temperature adjustment by the thermoelectric elements 13 and 14. The thermoelectric module 10 includes an internal fin 27 on an inner wall of the pipe 12. Consequently, for example, when the exhaust gas 28 passes through the inside of the pipe 12, heat of the exhaust gas 28 can be efficiently transmitted to the pipe 12. As a result, it is possible to enhance the efficiency of power generation and temperature adjustment by the thermoelectric elements 13 and 14.

A third embodiment will be explained. FIG. 12 shows a sectional front view of the thermoelectric module 10 in the third embodiment. In FIG. 12, an external fin 26 is formed on the outer surface of the housing 11, and an internal fin 27 is formed on the inner surface of the pipe 12. As a result, when heat exchange between the housing 11 and outside air is performed by air cooling, more efficient heat exchange is possible, and efficiency of the power generation and temperature adjustment by the thermoelectric elements 13 and 14 is enhanced.

Figure 13:
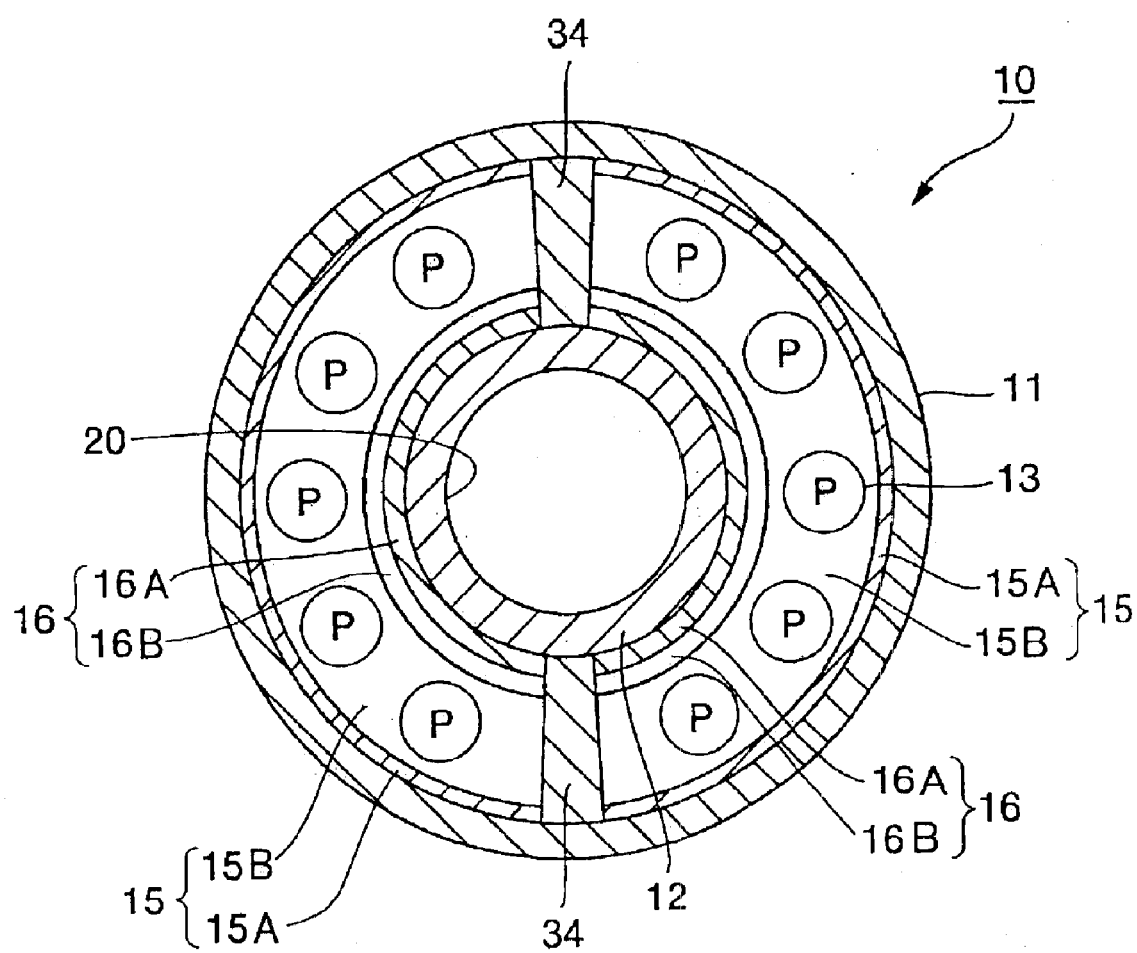
FIG. 13 is a sectional side view of a thermoelectric module according to a fourth embodiment of the present invention.

A fourth embodiment will be explained. FIG. 13 shows a sectional side view of the thermoelectric module 10 in the fourth embodiment. In FIG. 13, the inner electrode 16 and the outer electrode 15 are divided into two parts with a centerline as a boundary, and an insulator 34 is inserted between the two parts. Alternatively, instead of the insulator 34, a clearance may be provided so that the two parts are not continuous. Namely, in FIG. 13, the thermoelectric module 10 on the right side and the thermoelectric module 10 on the left side become the independent and separate thermoelectric modules 10 and 10. As a result, two thermoelectric modules 10 with a total A of the cross section areas of the thermoelectric elements 13 and 14 being one half, and height L being unchanged are operated.

Figure 14:
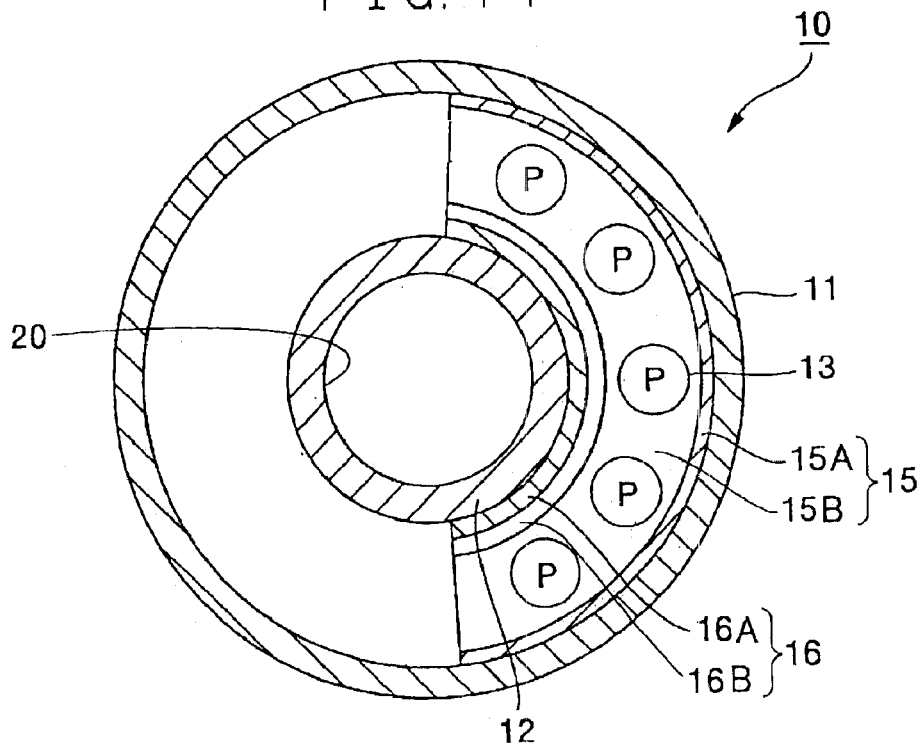
FIG. 14 is a sectional side view showing another constitution example of the thermoelectric module according to the fourth embodiment.

It is known that thermoelectric conversion efficiency in the thermoelectric module 10 is determined by the ratio A/L of the total A of the cross sectional areas of the thermoelectric elements 13 and 14 and the height L, and that the ratio A/L has an optimal value. Accordingly, by dividing the thermoelectric module 10 as shown in FIG. 13, it is made possible to change the ratio A/L to be closer to the optimal value and enhance the thermoelectric conversion efficiency of the thermoelectric module 10. The case in which the thermoelectric module 10 is divided into two is explained, but is may be suitable if it is divided so that the ratio A/L is close to the optimal value. For example, when the thermoelectric module 10 is divided into three, the ratio A/L of the divided thermoelectric module 10 becomes one third, and when it is divided into four, the ratio becomes one fourth. Alternatively, as shown in FIG. 14, out of the electrodes 15 and 16, which are divided into two parts, only one of the divided parts is made along the pipe 12. It is not limited to division into two parts, and the electrodes 15 and 16 may be formed in to suitable shapes such as one third, and three fourths of the entire circumference.

Figure 15:
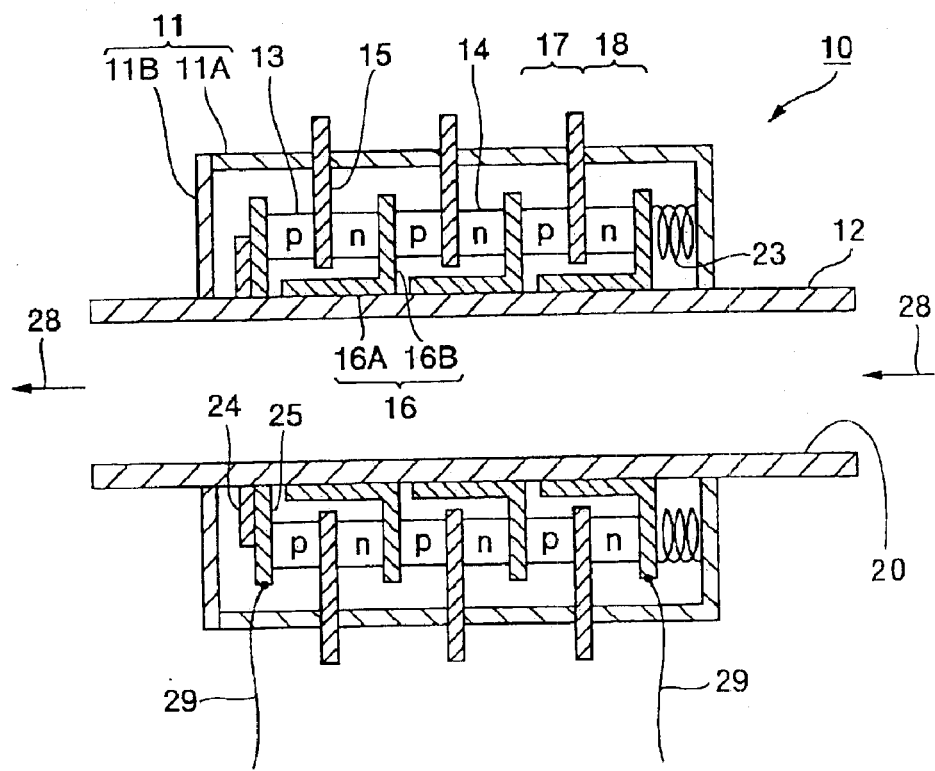
FIG. 15 is a sectional front view of a thermoelectric module according to a fifth embodiment of the present invention.

A fifth embodiment will be explained. FIG. 15 shows a sectional front view of the thermoelectric module 10 in the fifth embodiment. In FIG. 15, the outer electrode 15 is flat-shaped, and is protruded from an outer circumference part of the housing 11. An insulation layer (not shown) is attached between the outer electrode 15 and the housing 11. Alternatively, the housing 11 may be made of an insulating material. Consequently, the outer electrode 15 is brought directly into contact with outside air without interposing the housing 11 between them, thus reducing thermal loss of heat exchange between the outer electrode 15 and the outside air. Accordingly, efficient heat exchange is possible, and efficiency of power generation and temperature adjustment by the thermoelectric elements 13 and 14 are enhanced.

Figure 16:
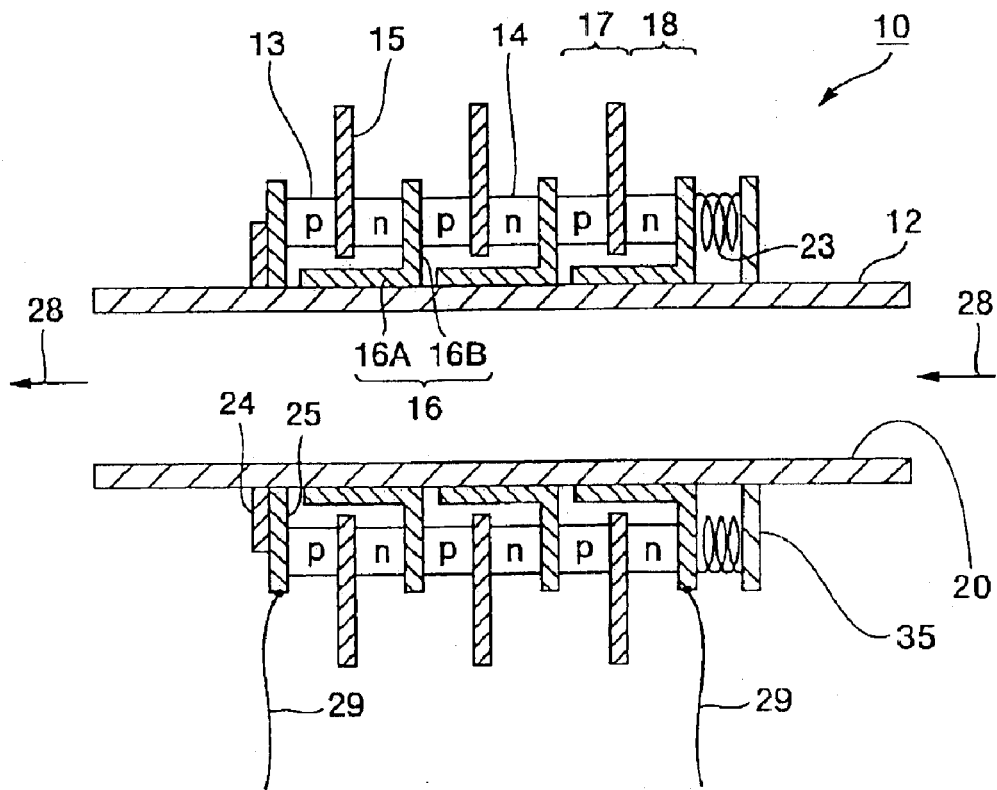
FIG. 16 is a sectional front view of a thermoelectric module according to a sixth embodiment of the present invention.

A sixth embodiment will be explained. FIG. 16 shows a sectional front view of the thermoelectric module 10 in the sixth embodiment. The thermoelectric module 10 in FIG. 16 has a shape, which is the result of taking the housing 11 from the thermoelectric module 10 shown in FIG. 15. A thread (not shown) is formed in the vicinity of a right end portion of the pipe 12 in FIG. 16, and a fixing nut 35 is screwed into this thread as the nut 24. As described above, by removing the housing 11, heat exchange between the outer electrode 15 and the outside air is carried out with higher efficiency.

Figure 17:
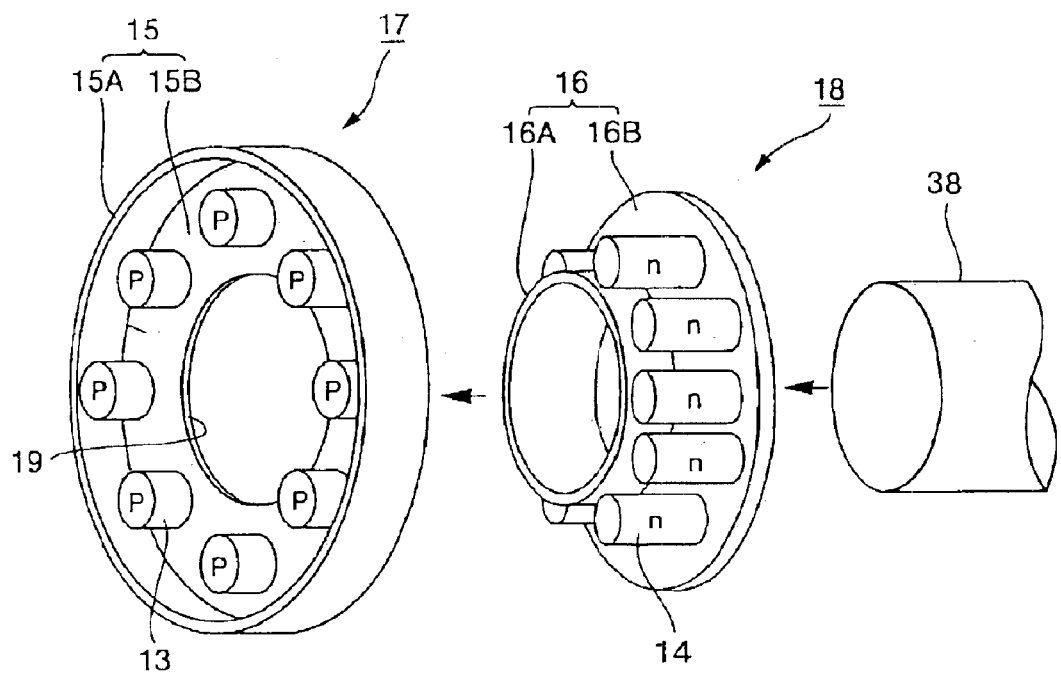
FIG. 17 is a perspective view of a thermoelectric module according to a seventh embodiment of the present invention.
Figure 18:
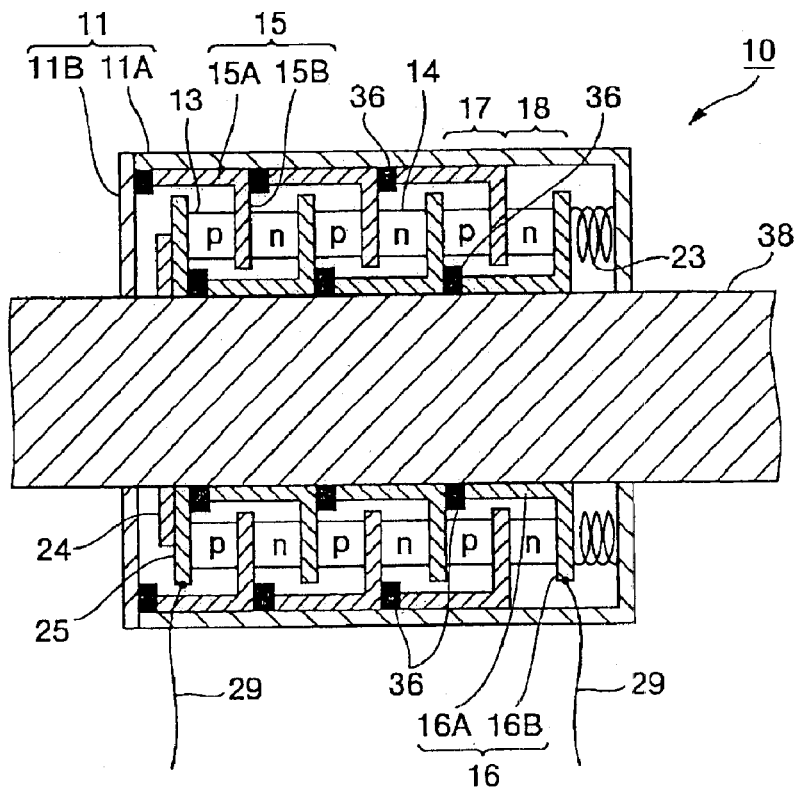
FIG. 18 is a sectional front view of the thermoelectric module in FIG. 17.

A seventh embodiment will be explained. FIG. 17 is a perspective view of the thermoelectric module 10 according to the seventh embodiment, and FIG. 18 shows a sectional front view thereof. In FIG. 17 and FIG. 18, the thermoelectric module 10 includes a solid rod 38 instead of the hollow pipe 12, and the p-type thermoelectric units 17 and the n-type thermoelectric units 18 are alternately fitted onto the circumference thereof. According to the seventh embodiment like this, it is possible to take heat from not only fluid passing through the inside of the pipe 12 but also from a solid such as the rod 38 to perform power generation and perform temperature adjustment of the solid.

Figure 19:
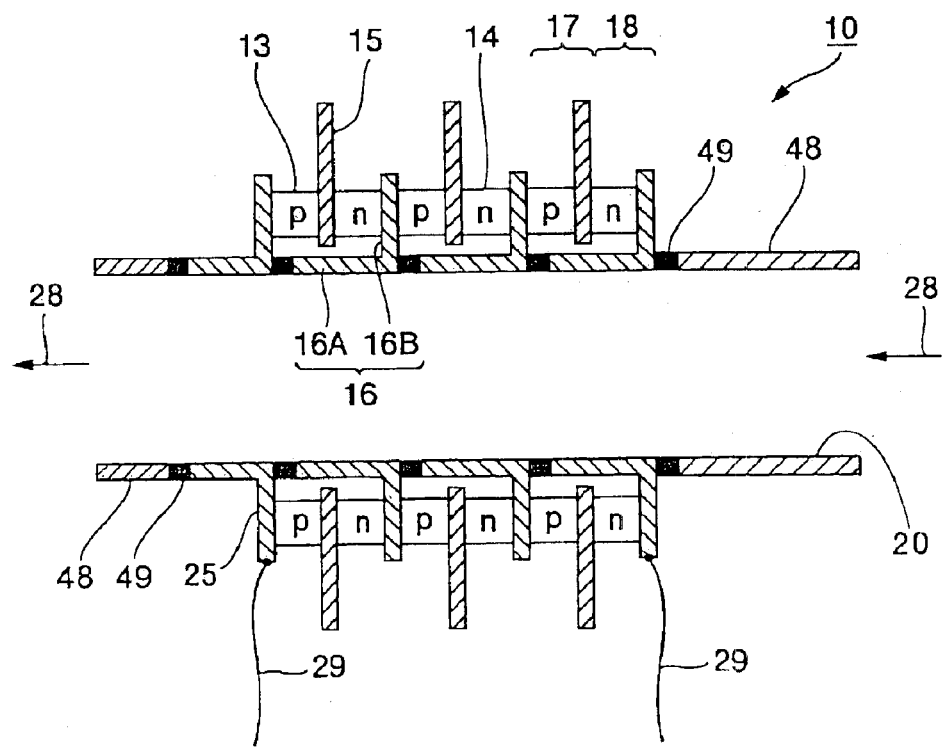
FIG. 19 is a sectional front view of a thermoelectric module according to an eighth embodiment of the present invention.

Next, an eighth embodiment will be explained. FIG. 19 shows a sectional front view of the thermoelectric module 10 in the eighth embodiment. In FIG. 19, in the thermoelectric module 10, the p-type thermoelectric units 17 and the n-type thermoelectric units 18 are alternately combined as in each of the above-described embodiments. The inner heat transfer plate 16A of the inner electrode 16 and the bottom plate 16B of the adjacent inner electrode 16 are bonded with, for example, resin-based adhesive 49 with insulation properties or the like. Further, the top surfaced of the p-type thermoelectric elements 13 and the bottom plates 16B of the inner electrodes 16 are soldered. The top surfaces of the n-type thermoelectric elements 14 and the bottom plates 15B of the outer electrodes 15 are soldered. Pipes 48 and 48 are bonded to the inner electrodes 16 and 16 on both ends with the adhesive 49.

Namely, a flow path 20 is formed by the inner heat transfer plate 16A of the inner electrode 16 without fitting the pipe 12 in an inside, and fluid such as the exhaust gas 28 is passed into the inside, for example. As a result, heat is directly transferred between the fluid and the inner heat transfer plate 16A without interposing the pipe 12 between them, thus enhancing the heat transfer efficiency. Instead of feeding the fluid into the flow path 20, the solid rod 38 may be fitted into the inside as in the seventh embodiment.

Figure 20:
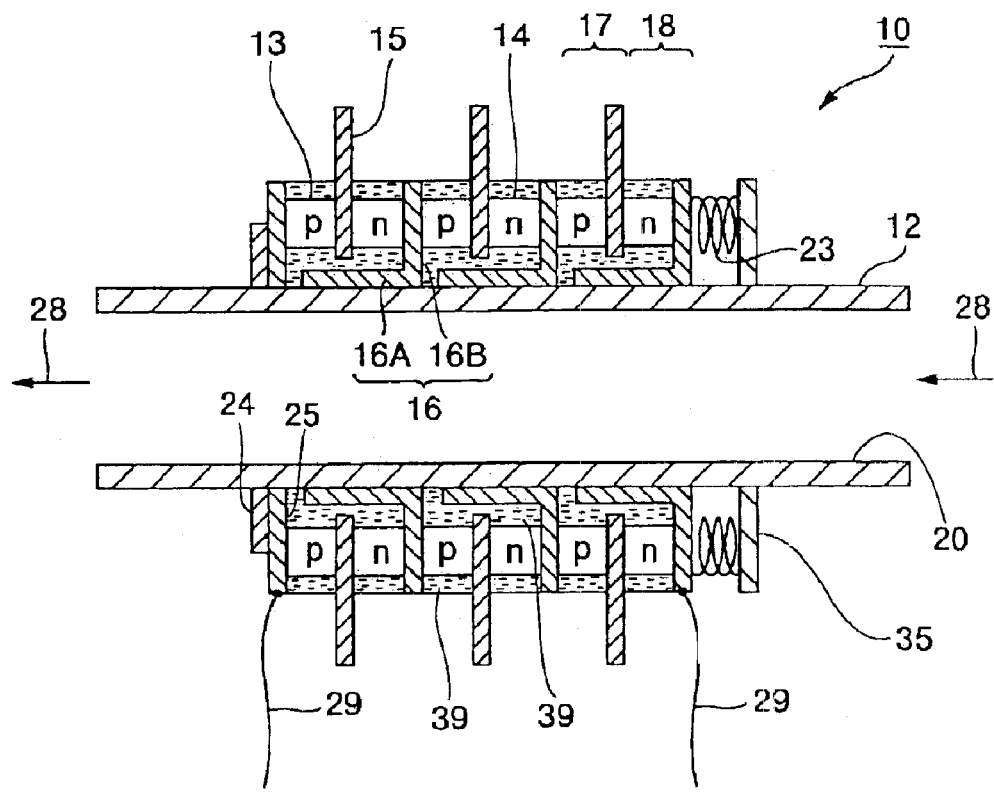
FIG. 20 is a sectional front view of a thermoelectric module according to a ninth embodiment of the present invention.

A ninth embodiment will be explained. FIG. 20 shows a sectional front view of the thermoelectric module 10 in the ninth embodiment. In FIG. 20, the thermoelectric module 10 is molded by charging a mold material 39 such as silicon rubber with insulation properties around the thermoelectric elements 13 and 14 of the thermoelectric module as shown in FIG. 16, for example. Consequently, heat releasing from the surfaces of the thermoelectric elements 13 and 14 is reduced, thus reducing the loss of energy, and efficiency of the thermoelectric module 10 is enhanced. Such mold is also applicable to the other embodiments.

In each of the above-described embodiments, the housing 11 and the pipe 12 are each formed into a cylindrical shape, but this is not restrictive. For example, at least either one may be in an ellipsoid shape, and further in a rectangular parallelepiped shape. However, the exhaust pipes are in a cylindrical shape in many cases, and at least the pipe 12 is made in a cylindrical shape, whereby it becomes possible to pass the exhaust gas to the inside favorably.

Figure 21:
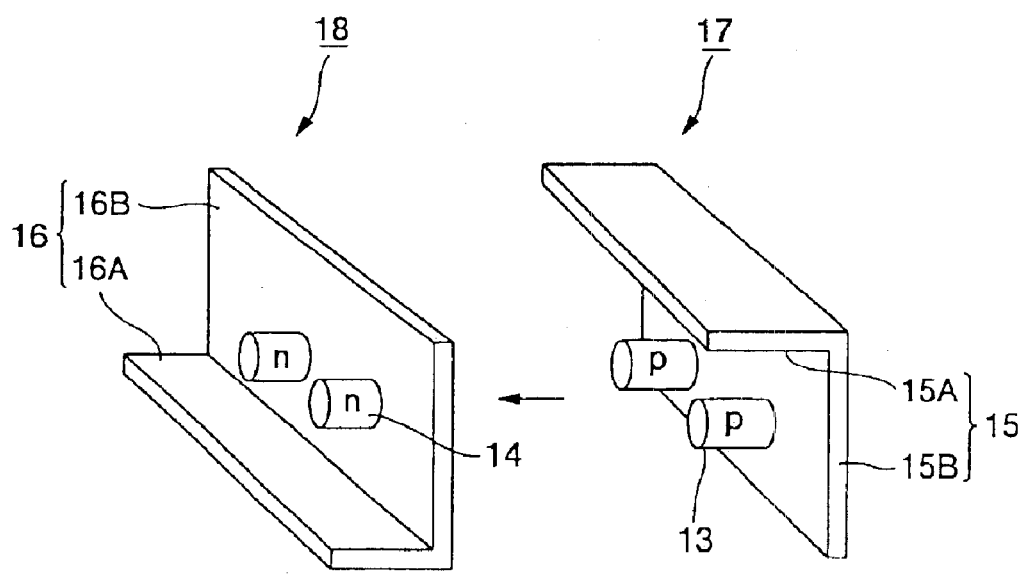
FIG. 21 is a perspective view of the thermoelectric units in a tenth embodiment.

A tenth embodiment will be explained. FIG. 21 shows a perspective view of the p-type thermoelectric unit 17 and the n-type thermoelectric unit 18 in the tenth embodiment. As shown in FIG. 21, the p-type thermoelectric unit 17 includes the L-shaped outer electrode 15 constituted by the rectangular outer heat transfer plate 15A and bottom plate 15B, and the bottom surfaces of the p-type thermoelectric elements 13 are soldered to the bottom plate 15B. Similarly, the n-type thermoelectric unit 18 includes the L-shaped inner electrode 16 constituted by the inner heat transfer plate 16A and the bottom plate 16B, and the bottom surfaces of the n-type thermoelectric elements 14 are soldered to the bottom plate 16B.

Figure 22:
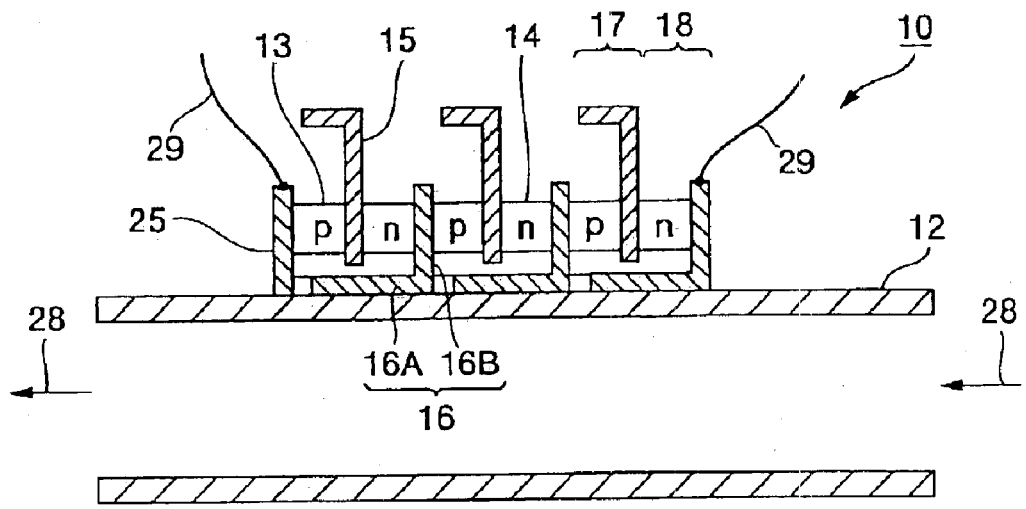
FIG. 22 is a sectional front view of a thermoelectric module according to the tenth embodiment.

FIG. 22 shows a sectional front view of the thermoelectric module 10 in which the thermoelectric units 17 and 18 are alternately combined. In FIG. 22, the pipe 12 has, for example, a rectangular shape, and the inner heat transfer plate 16A of the inner electrode 16 is in close contact with one side surface of the pipe 12. The top surface of the p-type thermoelectric element 13 and the bottom surface 16B of the inner electrode 16 are, for example, soldered. The top surface of the n-type thermoelectric element 14 and the bottom plate 15B of the outer electrode 15 are similarly soldered. Alternately, it is suitable to make the thermoelectric units 17 and 18 press each other in the axial direction by known means (not shown).

Figure 23:
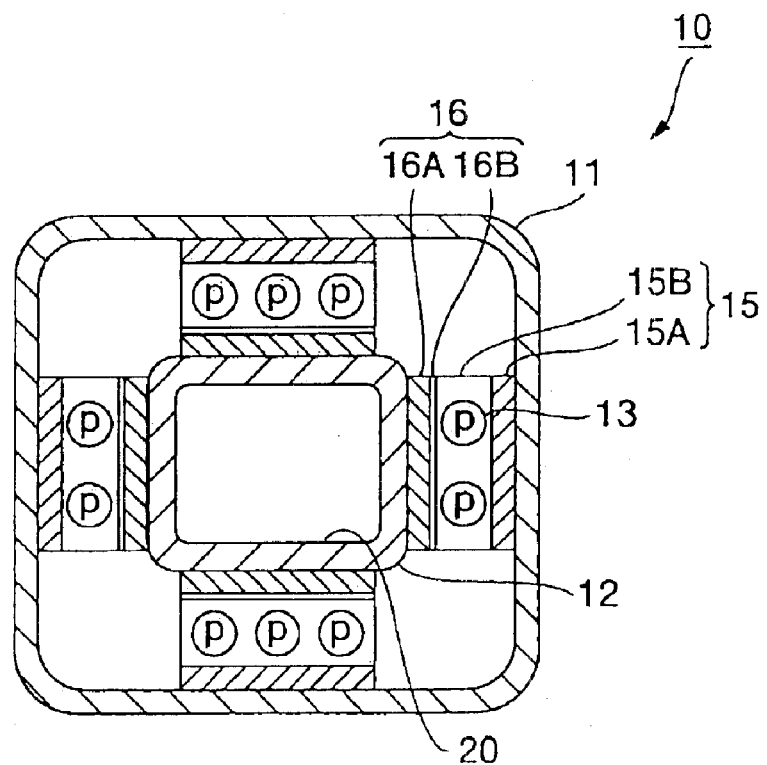
FIG. 23 is a sectional front view showing another constitution example of the thermoelectric module according to the tenth embodiment.

As described above, with respect to an object in an optional shape with which heat exchange is performed, the inner electrode 16 is formed in the shape to be along the above-described object, whereby power generation or temperature adjustment is possible. The outer electrode 15 is similar to the above, and in FIG. 22, it is described that the outer electrode 15 is air-cooled, but the case, in which, for example, a water-cooling jacket or the like is in contact with the outer electrode 15, is similar to the above. Further, as shown in FIG. 23, for the rectangular pipe 12, four thermoelectric modules may be placed so that the inner electrode 16 is in contact with each surface of the pipe 12. Alternatively, the inner electrodes 16 may be in contact with one to three surfaces instead of all the four surfaces of the pipe 12.

In each of the above-described embodiments, it is described that the outer electrode 15 and the inner electrode 16 respectively have the bottom plates 15B and 16B in contact with the thermoelectric elements 13 and 14, and the heat transfer plates 15A and 16A substantially perpendicular to them, but this is not restrictive. For example, either one or both of them may be a disc-shaped flat plate or flat plates without having the heat transfer plates 15A and 16A. However, as in the above-described embodiments, when the heat transfer plates 15A and 16A are brought into contact with the housing 11 and the pipe 12, heat is more efficiently transferred between them, and efficiency of the thermoelectric module 10 is enhanced.

Figure 24:
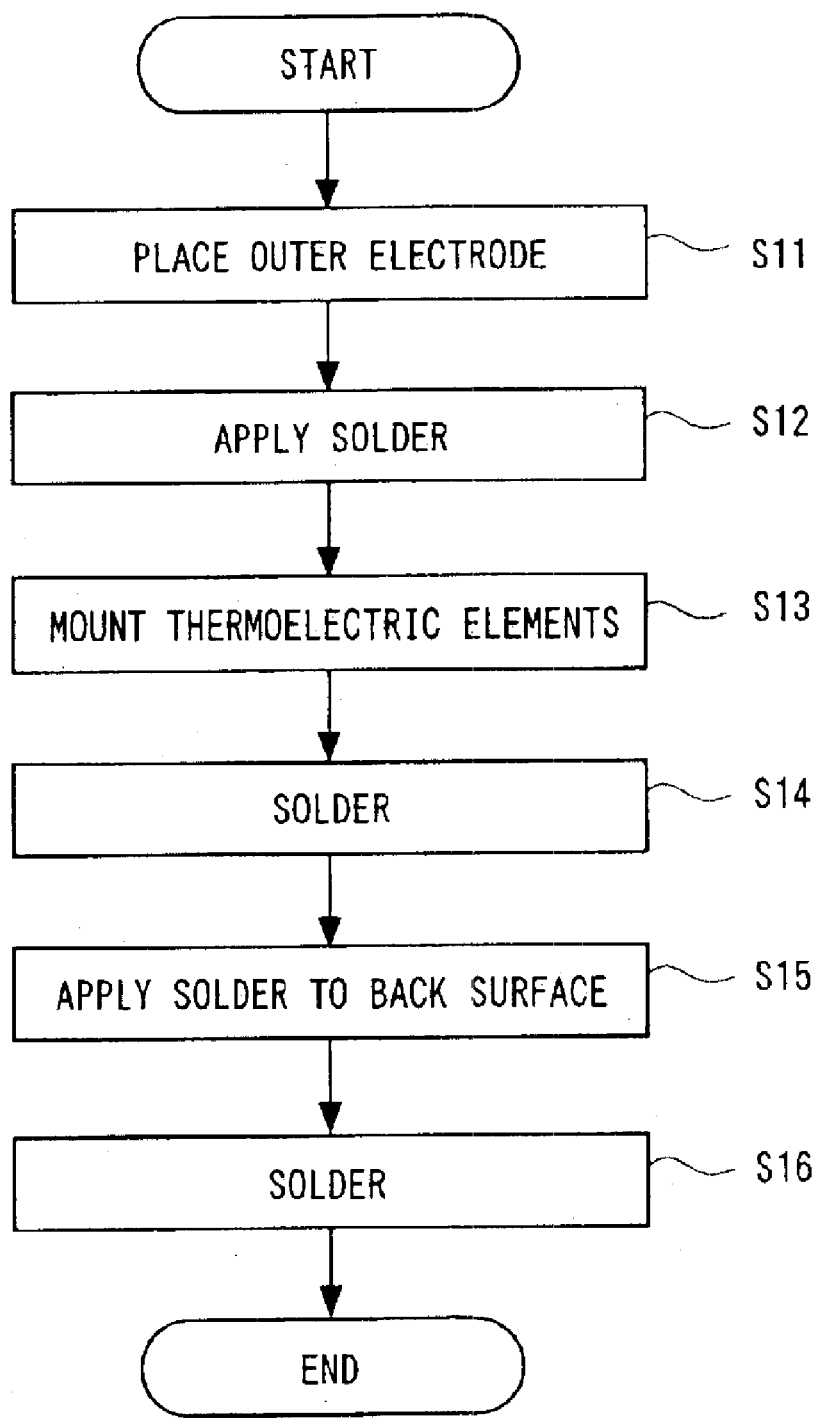
FIG. 24 is a flowchart showing a production procedure of a thermoelectric module according to an eleventh embodiment of the present invention.

Next, an eleventh embodiment will be explained. In the eleventh embodiment, an art of soldering the thermoelectric elements 13 and 14 to the electrodes 15 and 16 more efficiently will be explained. The explanation is made with the outer electrode 15 and the p-type thermoelectric element 13 taken as an example, but the same can be said of the inner electrode 16 and the n-type thermoelectric element 14. FIG. 24 is a flowchart showing the procedure of soldering, and FIG. 25 to FIG. 30 are explanatory views thereof.

Figure 25:
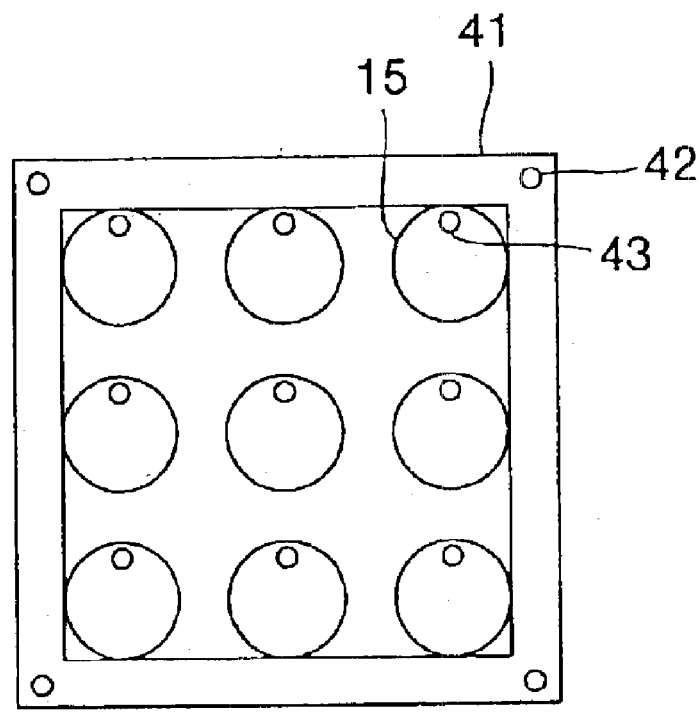
FIG. 25 to FIG. 30 are explanatory views showing a production procedure of the thermoelectric module according to the eleventh embodiment.
Figure 26:
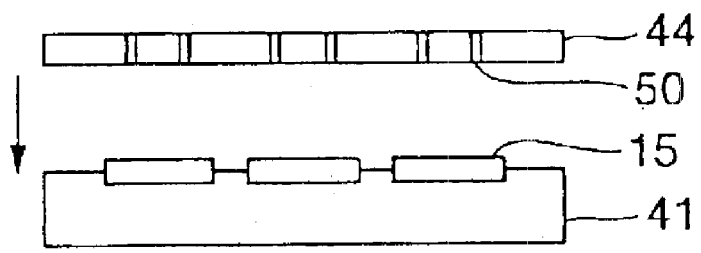

As shown in FIG. 25, the outer electrodes 15 are placed at predetermined positions on a flat plate 41 of metal or the like (step S11). In this situation, on the flat plate 41, for example, an impression is provided at the position where the outer electrode 15 is placed. In FIGS. 25, 42 and 43 denote positioning holes for positioning the flat plate 41 and the outer electrode 15. As shown in FIG. 26, a soldering screen 44 provided with holes 50 at predetermined soldering positions is put on the outer electrode 15 from above, and cream solder 46 (not shown in FIG. 26) is applied thereon (step S12). As a result, as shown in FIG. 27, the cream solder 46 is attached to predetermined positions of the outer electrodes 15.

Figure 27:
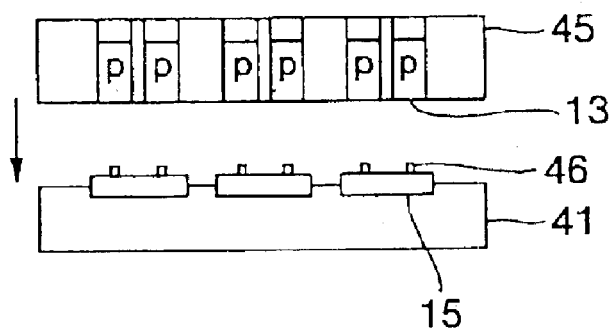
Figure 28:
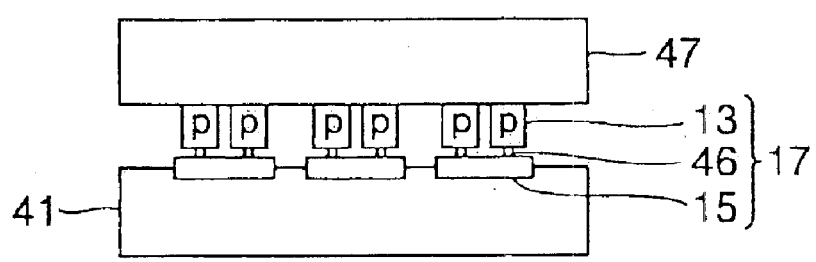

Next, as shown in FIG. 27, an element inserting jig 45 in which the p-type thermoelectric elements 13 are fitted in predetermined positions is put on the outer electrode 15 from above, and the p-type thermoelectric elements 13 are pressed from above to be removed. As a result, the p-type thermoelectric elements 13 are placed on the cream solder 46 (step S13). As shown in FIG. 28, a weight 47 is placed on the p-type thermoelectric elements 13 from above, and this is put into a heating furnace (not shown) and heated to perform soldering (step S14), whereby the p-type thermoelectric unit 17 is made.

Figure 29:
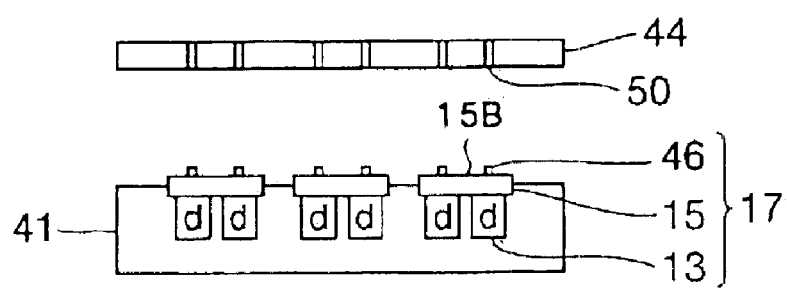
Figure 30:
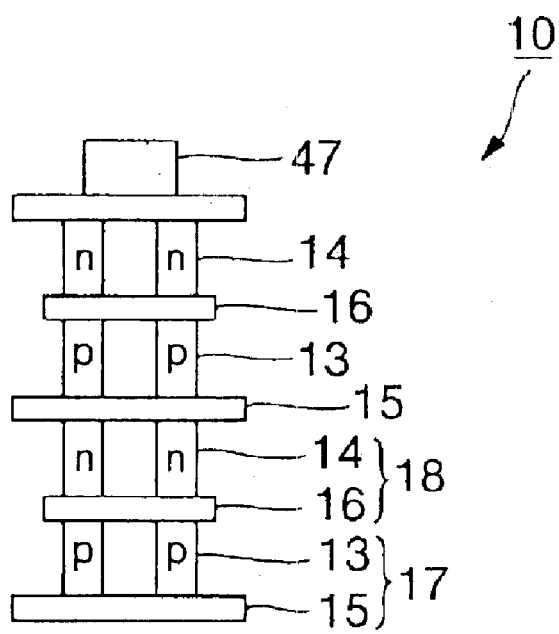

The p-type thermoelectric unit 17 thus produced is turned over as shown in FIG. 29, and the cream solder 46 is applied onto a back surface of the bottom plate 15B of the outer electrode 15 with use of a soldering screen 44 as in step S12 (step S15). The n-type thermoelectric unit 18 is produced similarly, and the cream solder 46 is applied onto the back surface. The p-type thermoelectric units 17 and the n-type thermoelectric units 18 with the cream solder 46 being applied to each back surface are alternately laid on each other as shown in FIG. 30, then the weight 47 is put thereon, and soldering is performed inside the heating furnace (not shown) (step S16). By using such procedure, the thermoelectric module 10 can be produced efficiently. Connection between the thermoelectric elements 13 and 14 and the electrodes 15 and 16 is not limited to the cream solder 46, and, for example, a conductive adhesive may be used, or only pressing them against each other without using solder and the like may be adopted.

Figure 31:
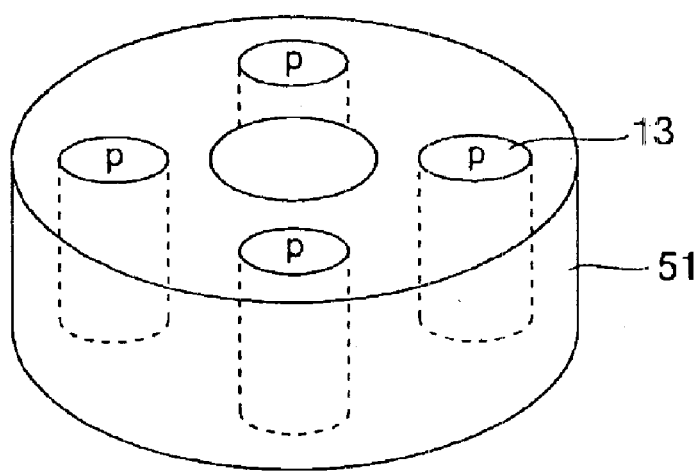
FIG. 31 is an explanatory view of an element holder according to a twelfth embodiment of the present invention.

A twelfth embodiment will be explained. In the twelfth embodiment, an art on the occasion of placing the thermoelectric elements 13 and 14 are placed on the flat plates 41 in step S13 will be explained. According to the twelfth embodiment, as shown in FIG. 31, the thermoelectric elements 13 and 14 are previously embedded at predetermined positions inside element holders 51 of silicon rubber or the like, including heat resistance and insulation properties so that the top surfaces and the bottom surfaces are exposed, and they are placed on the flat plates 41. Then, instead of removing the thermoelectric elements 13 and 14 from the element holders 51 as in step S13, soldering is performed in the state in which the thermoelectric elements 13 and 14 are embedded in the element holders 51, in step S14. As a result, as the mold material 39 which is explained in the ninth embodiment, the circumferences of the thermoelectric elements 13 and 14 are surrounded by the element holders 51 with insulation properties, and therefore energy loss by heat radiation from the thermoelectric elements 13 and 14 is reduced, and the efficiency of the thermoelectric module 10 is enhanced. Further, it is not necessary to mold individually as in the ninth embodiment, and thus labor saving in production is achieved.

Figure 32:
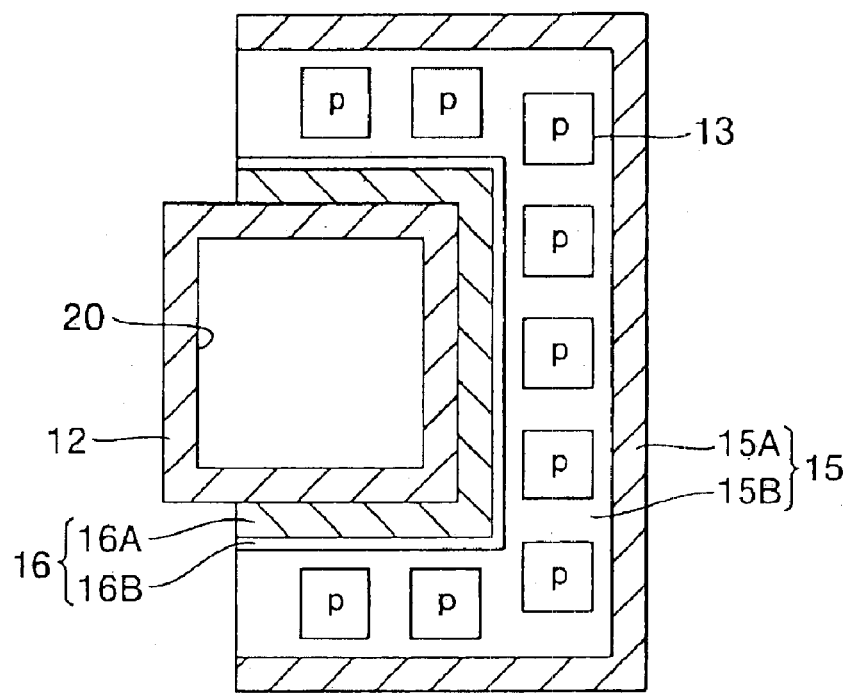
FIG. 32 is a sectional side view of a thermoelectric module according to a thirteenth embodiment of the present invention.
Figure 33:
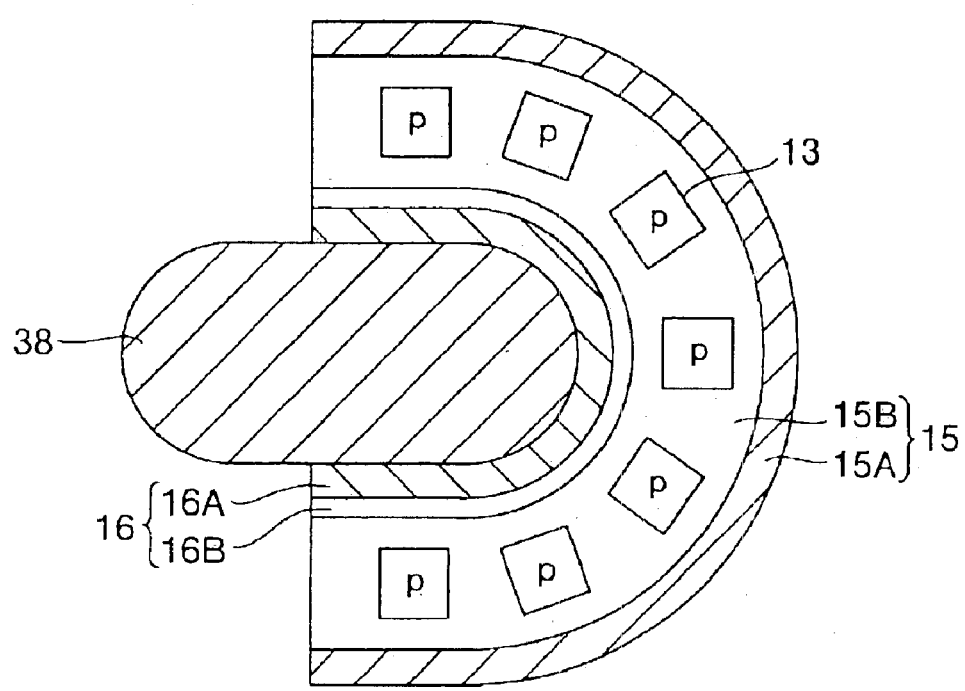
FIG. 33 is a sectional side view of another constitution example of the thermoelectric module according to the thirteenth embodiment.
Figure 34:
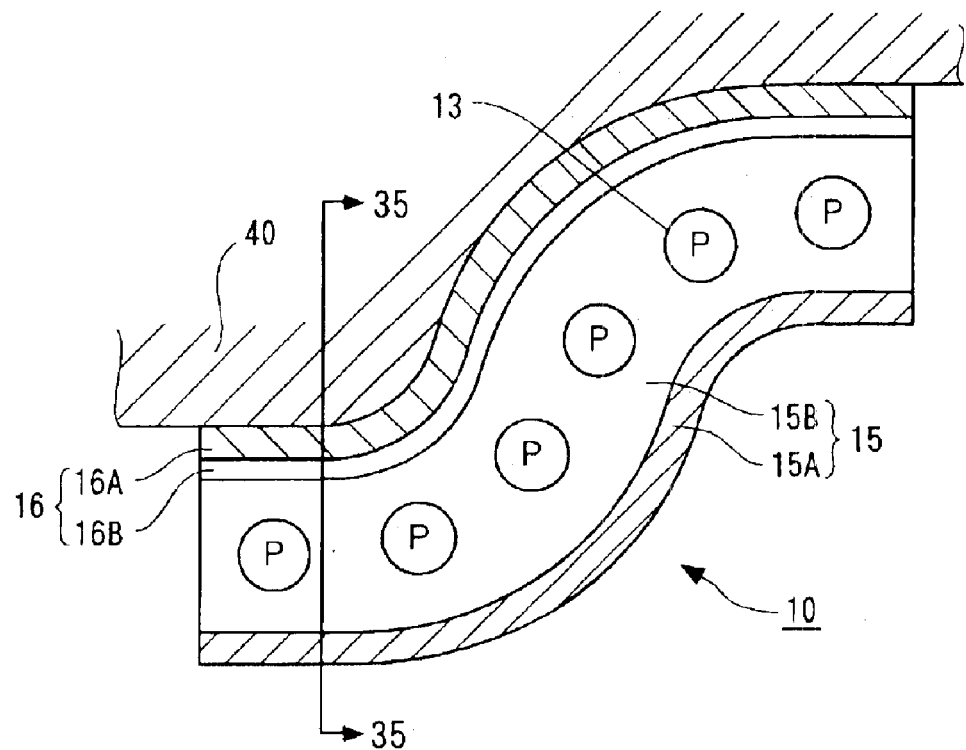
FIG. 34 is a sectional side view of still another constitution example of the thermoelectric module according to the thirteenth embodiment.
Figure 35:
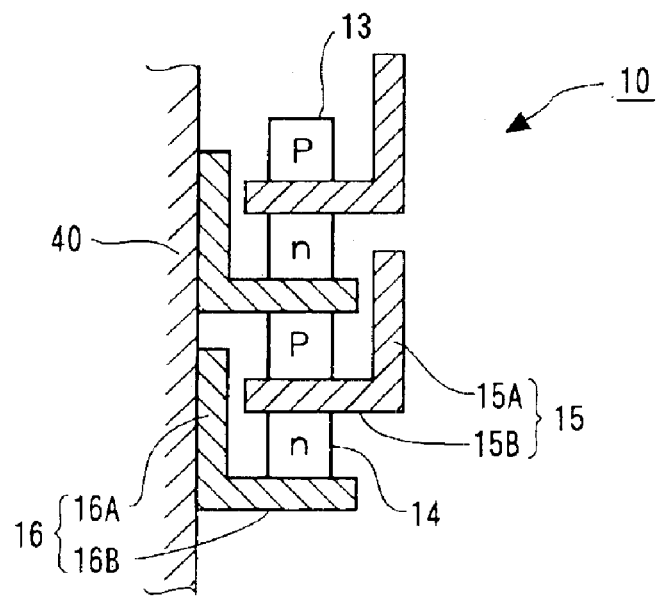
FIG. 35 is an explanatory view in a section taken along the line 35—35 in FIG. 34.
Figure 36:
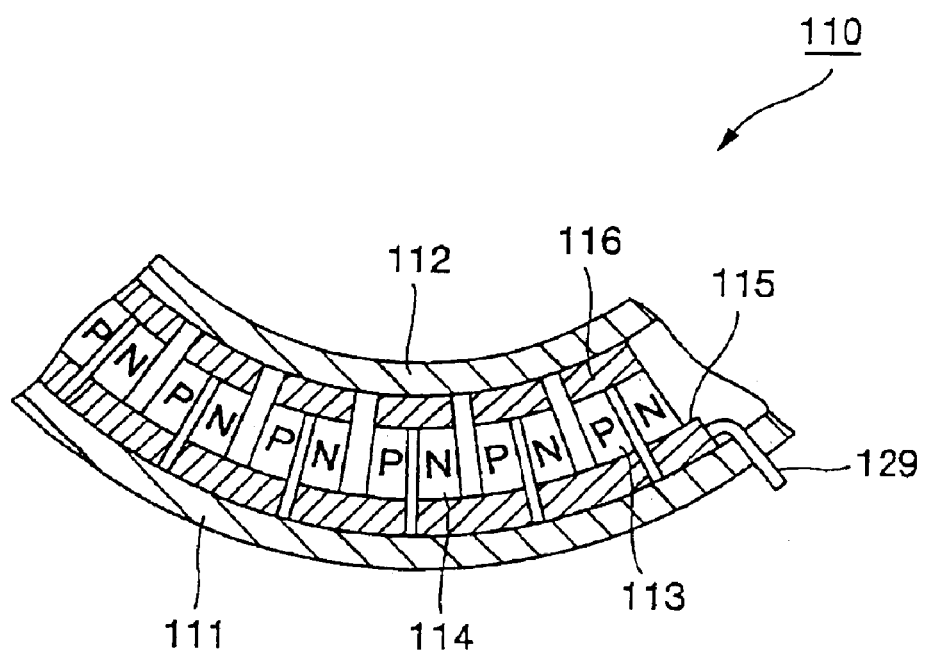
FIG. 36 is a sectional view of a thermoelectric module according to a first prior art.
Figure 37:
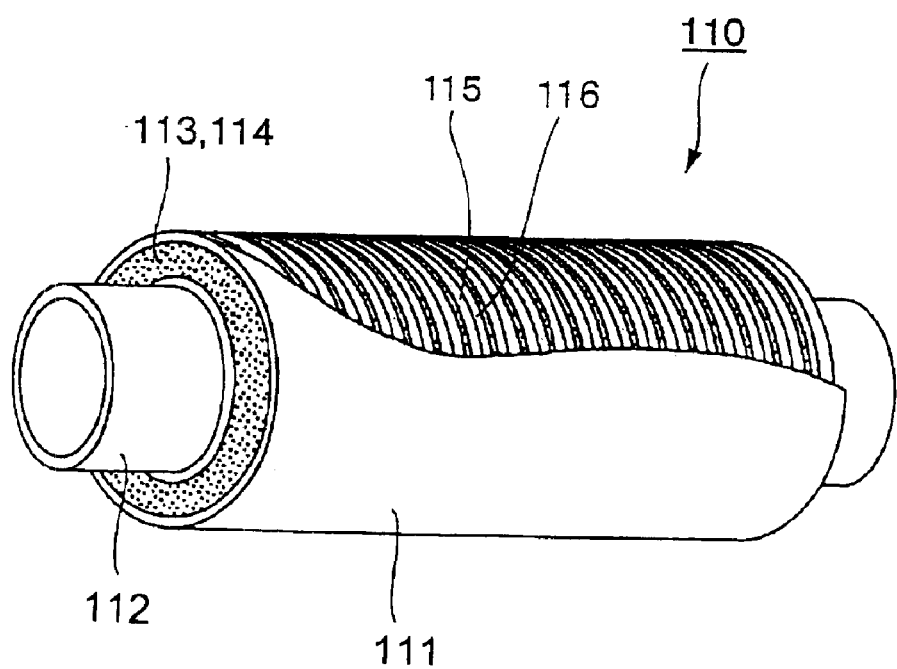
FIG. 37 is a perspective view of a thermoelectric module according to a second prior art.

A thirteenth embodiment will be explained. FIG. 32 shows a sectional side view of the thermoelectric module 10 according to the thirteenth embodiment. In FIG. 32, the thermoelectric module 10 includes the inner electrode 16 and the outer electrode 15 each in a shape of laterally oriented "U". The heat transfer plate 16A of the inner electrode 16 is in contact with part of an outer wall surface of the square pipe 12. FIG. 33 shows another constitution example of the thermoelectric module 10 according to the thirteenth embodiment. In FIG. 33, the rod 38 has an oval-shaped cross section. FIG. 34 and FIG. 35 show sill another constitution example of the thermoelectric module 10 according to the thirteenth embodiment. In FIG. 34 and FIG. 35, the heat transfer plates 16A of the inner electrodes 16 each have a curved surface shape which is along a curved surface member 40. Consequently, this is applicable to the objects such as the pipe 12, the rod 38 and the curved surface member 40, with which heat exchange is performed, in all the shapes such as a square shape, an oval shape, curved surface and so on. Namely, it is possible to generate power and adjust the temperature of the rod 38, the curved surface member 40 and the fluid by taking heat from the fluid flowing inside the pipe 12 and the rod 38. In each of the above-described embodiments, it is described that the entire surfaces of the electrodes 15 and 16, or the heat transfer plates 15A and 16A are in contact with the heat exchange object, but only part the electrodes 15 and 16, or the heat transfer plates 15A and 16A may be in contact with the object.

Further, the constitution of the embodiments according to the thermoelectric module of the present invention and the operational effects are listed.

(1) The thermoelectric module may include the hollow pipe, the p-type and n-type thermoelectric elements, which are alternately placed in the axial direction of the pipe, the outer electrodes and the inner electrodes in contact with the pipe, which are alternately placed in the axial direction of the pipe, between the thermoelectric elements. This eliminates the need to make a surface of the thermoelectric element, which is in contact with the electrode, a curved surface, and makes it possible to realize the constitution using ordinary thermoelectric elements, for example, in a rectangular parallelepiped shape and a cylindrical shape.

(2) In the thermoelectric module, the outer diameter of the outer electrode may be made larger than the outer diameter of the inner electrode. Thereby, the outer electrode plays a role of a fin for exchanging heat, and heat exchange efficiency is enhanced.

(3) The thermoelectric module may include the hollow pipe, the housing enclosing the outer circumferential part of the pipe, the p-type and the n-type thermoelectric elements, which are alternately placed in the axial direction of the pipe, the outer electrode and the inner electrode in contact with the pipe, which are alternately placed in the axial direction of the pipe between the thermoelectric elements. By adopting the constitution including the housing like this, the thermoelectric elements can be protected from outside air.

(4) In the thermoelectric module, the outer electrode may be protruded to an outside of the housing. Thereby, the outer electrode plays a role of a fin for exchanging heat, and heat exchange efficiency is enhanced.

(5) In the thermoelectric module, the outer electrode may include the bottom plate in contact with the thermoelectric elements, and the heat transfer plate which is formed substantially perpendicularly to the bottom plate and in contact with the housing, and the inner electrode may include the bottom plate in contact with the thermoelectric elements, and the heat transfer plate which is formed substantially perpendicularly to the bottom plate and in contact with the pipe. Thereby, heat is efficiently transmitted from the pipe and the housing to the electrode, and the efficiency of the thermoelectric module is enhanced.

(6) In the thermoelectric module, the thermoelectric units each including the thermoelectric elements and the electrode jointed to the surfaces of one side of the thermoelectric elements may be brought into contact with each other without being jointed to each other to form the thermoelectric module. Thereby, when thermal stress occurs to the thermoelectric module, only the contact portions are displaced, and the joint portions or the thermoelectric elements are not broken.

(7) In the thermoelectric module, the thermoelectric elements and the electrodes may be in contact with each other without being jointed with each other to form the thermoelectric module. Thereby, even when thermal stress occurs to the thermoelectric module, only the contact portions are displaced, and the joint portion or the thermoelectric elements are not broken.

(8) In the thermoelectric module, all the electrodes may be divided into at least two or more. As a result, the ratio of the total sectional areas of the thermoelectric elements and the height can be made the value with the highest thermoelectric conversion efficiency, and the efficiency of the thermoelectric module is enhanced.

What is claimed is:

1. A thermoelectric module, comprising;
   at least one first p-type thermoelectric unit which is provided along an object and which comprises a plurality of p-type thermoelectric elements and a first electrode in contact with the plurality of p-type thermoelectric elements;
   at least one second n-type thermoelectric unit which is adjacent to the first thermoelectric unit along the object, and which comprises a plurality of n-type thermoelectric elements and a second electrode in contact with the plurality of n-type thermoelectric elements;
   wherein at least a part of one of the first electrode and the second electrode has a shape which approxiately conforms to a shape of the object such that the first electrode and the second electrode exchange heat with the object.

2. The thermoelectric module according to claim 1, wherein the at least one first thermoelectric unit comprises a plurality of first thermoelectric units, and the at least one second thermoelectric unit comprises a plurality of second thermoelectric units; and
   wherein the plurality of first thermoelectric units and the plurality of second thermoelectric units alternate along the object.

3. The thermoelectric module according to claim 1, wherein the plurality of p-type thermoelectric elements and the plurality of n-type thermoelectric elements are shaped as at least one of columns, sectors, and rectangular parallelepipeds.

4. The thermoelectric module according to claim 1, wherein the first electrode comprises: (i) a bottom plate on which the plurality of p-type thermoelectric elements are mounted, and (ii) a heat transfer plate extending away from the bottom plate; and
   wherein the second electrode comprises: (i) a bottom plate on which the plurality of n-type thermoelectric elements are mounted, and (ii) a heat transfer plate extending away from the bottom plate.

5. The thermoelectric module according to claim 4, wherein the heat transfer plate of the second electrode comprises an inner heat transfer plate which extends from an inner portion of the bottom plate of the second electrode; and
   wherein said part of said one of first electrode and the second electrode which approximately conforms to the shape of the object comprises the inner heat transfer plate.

6. The thermoelectric module according to claim 5, wherein the inner heat transfer plate approximately surrounds the object.

7. The thermoelectric module according to claim 6, wherein the inner heat transfer plate and the bottom plate of the second electrode comprise a slit, and wherein an inner diameter of the inner heat transfer plate is smaller than an outer diameter of the object.

8. The thermoelectric module according to claim 4, wherein at least one of the heat transfer plate of the first electrode and the heat transfer plate of the second electrode comprise a plurality of notches.

9. The thermoelectric module according to claim 1, wherein the plurality of p-type thermoelectric elements and the plurality of n-type thermoelectric elements are mounted on the second electrode.

10. The thermoelectric module according to claim 1, wherein the first thermoelectric unit and the second thermoelectric unit partially surround the object.

11. The thermoelectric module according to claim 1, further comprising a housing which encases the at least one first thermoelectric unit and the at least one second thermoelectric unit.

12. The thermoelectric module according to claim 11, wherein the first electrode extends through the housing.

13. The thermoelectric module according to claim 11, further comprising a water cooling jacket which surrounds the housing so as to cool the housing when water flows therethrough.

14. The thermoelectric module according to claim 11, wherein the object comprises a pipe, and wherein a plurality of fins extend inward from an inner surface of the pipe.

15. The thermoelectric module according to claim 11, further comprising a plurality of heat exchange fins extending outward from the housing.

16. The thermoelectric module according to claim 15, wherein the object comprises a pipe, and wherein a plurality of fins extend inward from an inner surface of the pipe.

17. The thermoelectric module according to claim 1, wherein the first thermoelectric unit comprises a plurality of separated partial first thermoelectric units, and the second thermoelectric unit comprises a plurality of separated partial second thermoelectric units.

18. The thermoelectric module according to claim 1, further comprising at least one spring for maintaining contact between the first thermoelectric unit and the second thermoelectric unit.

19. The thermoelectric module according to claim 1, further comprising an insulating mold material surrounding the plurality of p-type thermoelectric elements and the plurality of n-type thermoelectric elements.

* * * * *